United States Patent
Ba-Tis et al.

(10) Patent No.: US 10,582,100 B1
(45) Date of Patent: Mar. 3, 2020

(54) FIVE DEGREES OF FREEDOM MEMS ACTUATOR FOR AUTOFOCUS, OPTICAL IMAGE STABILIZATION, AND SUPER RESOLUTION IMAGING IN MINIATURE CAMERAS

(71) Applicants: Faez Ba-Tis, Toronto (CA); Ali Banss, Toronto (CA); Ahmed Galaom, Toronto (CA); Ridha Ben-Mrad, Toronto (CA)

(72) Inventors: Faez Ba-Tis, Toronto (CA); Ali Banss, Toronto (CA); Ahmed Galaom, Toronto (CA); Ridha Ben-Mrad, Toronto (CA)

( * ) Notice: Subject to any disclaimer, the term of this patent is extended or adjusted under 35 U.S.C. 154(b) by 0 days.

(21) Appl. No.: 16/239,897

(22) Filed: Jan. 4, 2019

(51) Int. Cl.
| | |
|---|---|
| *H04N 5/225* | (2006.01) |
| *H04N 5/232* | (2006.01) |
| *B81B 3/00* | (2006.01) |
| *H02N 1/00* | (2006.01) |

(52) U.S. Cl.
CPC ......... *H04N 5/2253* (2013.01); *B81B 3/0062* (2013.01); *H02N 1/002* (2013.01); *H02N 1/008* (2013.01); *H04N 5/23287* (2013.01); *B81B 2203/0136* (2013.01); *B81B 2203/053* (2013.01)

(58) Field of Classification Search
None
See application file for complete search history.

(56) References Cited

U.S. PATENT DOCUMENTS

| 2005/0040919 A1* | 2/2005 | Baeck | H02N 1/008 335/78 |
| 2006/0284514 A1* | 12/2006 | Ko | G02B 26/0841 310/309 |
| 2016/0187614 A1* | 6/2016 | Shih | G02B 7/08 359/557 |
| 2016/0187615 A1* | 6/2016 | Shih | G02B 7/105 359/557 |

* cited by examiner

*Primary Examiner* — Quan Pham
(74) *Attorney, Agent, or Firm* — Nasser Ashgriz; UIPatent Inc.

(57) ABSTRACT

A MEMS electrostatic actuator that provides 5 degrees of freedom (5-DOF) motion is disclosed. The actuator comprises of an inner, a middle, and an outer MEMS structures that are nested with respect to each other. Each of the structures comprise of a plurality of rotors and stators. The rotors further comprise a plurality of moving capacitive electrodes which engage with a plurality of fixed capacitive electrodes in the stators to provide a variety of translational and rotational motions.

13 Claims, 20 Drawing Sheets

452 — Tilt motion of the outer rotor about the y-axis

600 Image sensor 100 5DOF MEMS electrostatic actuator

FIVE DEGREES OF FREEDOM MEMS ACTUATOR FOR AUTOFOCUS, OPTICAL IMAGE STABILIZATION, AND SUPER RESOLUTION IMAGING IN MINIATURE CAMERAS

FIELD OF THE INVENTION

The invention relates, generally, to the field of MEMS electrostatic actuators that provide large forces and are able to translate and rotate large masses, and particularly, to the field of miniature cameras to achieve autofocus (AF) and/or optical image stabilization (OIS) to counteract hand-shaking motion, and super resolution imaging to achieve zooming.

BACKGROUND OF THE INVENTION

Different types of MEMS electrostatic micro-actuators have been used to achieve Autofocus (AF) and Optical Image Stabilization (OIS) in miniature cameras. U.S. Pat. No. 9,264,591B2 discloses a MEMS electrostatic actuator to achieve OIS and AF by providing a multiple of degrees of freedom (DOF) motion to move the image sensor. The actuator also utilizes mechanical flexures/springs between the driving comb electrodes and the load stage for the purpose of amplifying the rotational strokes and to reduce the coupling effect between motion along different axes. Such structure, elastic flexures between the load and driving electrodes, significantly reduces the electrostatic forces acting on the load. It also introduces mechanical coupling between different motions as one set of springs (i.e. four mechanical springs) are connected to a single load stage and are responsible to move the load stage along multiple axes. When the driving electrodes move the load along one axis of motion by exerting a force transmitted to the load through two springs, the other two springs connected to the load transmit the motion to other not-moving electrodes and vice versa. Such mechanical coupling is undesired in MEMS actuation.

Another MEMS electrostatic actuator is used to achieve OIS in miniature cameras and presented in U.S. Pat. No. 9,578,217B2. The actuator is able to move the image sensor along 3-DOF in-plane motion, i.e., translation along the x and y axes and rotation about the z-axis to achieve OIS. This actuator is unable to provide translational motion along the optical axis z to achieve autofocus, which makes its use in compact cameras. Therefore, it has limited benefits as it provides only a partial functionality for a camera (achieves OIS only and not AF).

There is an increasing need for a single actuator that is able to provide large force and totally decoupled motion along the 3 axes (x, y, and z) such that autofocus, optical image stabilization and super resolution imaging are all enabled using the single MEMS actuator.

SUMMARY OF THE INVENTION

The present invention discloses a 5 degrees-of-freedom (5-DOF) electrostatic microactuator that is able to provide the translation motions along the x, y, and z axes and two bi-axial tilt motion about the x and y axes. The actuator utilizes nested MEMS structures such that the translation motion along each axis is totally decoupled from the motion along the other axes.

The novel 5 degrees-of-freedom (5-DOF) electrostatic microactuator consists of 3 MEMS structures that are nested with respect to each other. These structures are referred to as inner, middle, and outer MEMS structures. The inner MEMS structure provides in-plane translation motion along the x-axis and it holds the load stage. The inner MEMS structure is rigidly attached to the rotor of the middle MEMS structure and is mechanically separated from the stator of the middle MEMS structure through trenches. Therefore, the inner MEMS structure holding the target load is considered as a load that has to be displaced by the rotor of the middle MEMS structure which provides a translation motion along the y-axis. Similarly, the middle MEMS structure is rigidly attached to the rotor of the outer MEMS structure and is mechanically separated from the stator of the outer MEMS structure. Therefore, the inner and outer MEMS structures are considered as a load that needs to be displaced by the rotor of the outer MEMS structure in a 3-DOF motion, i.e. translation along the z-axis, and bi-axial tilt about the x and y axes.

The actuator is fabricated using tow silicon wafers: upper and lower. The lower one is a Silicon on Insulator (SOI) that has an insulating layer to be utilized for the electrical insulation between various MEMS structures. The upper structure is a standard Si wafer. Different parts of the 3 MEMS structures are formed within the thicknesses of those wafers.

The inner MEMS structure consists of an inner stator and an inner rotor. The inner stator comprises a base, an electrical insulating layer, an electrical connection layer, fixed comb electrodes, fixed combs' supporting pillars, and a bonding frame that mechanically connects the inner MEMS structure with the rotor of the middle MEMS structure. The inner rotor comprises a load stage, moving comb electrodes that are rigidly connected to each other and are attached to the inner stator via a plurality of mechanical springs. The moving comb electrodes are horizontally aligned with the fixed comb electrodes in the inner stator along the x-y plane.

The mechanical springs of the inner rotor are designed to be compliant/elastic along the in-plane axis x, and highly stiff along the other axes of motion (y and z). When a voltage potential is applied across the fixed and moving comb electrodes in the inner MEMS structure, an electrostatic force develops between the electrodes which results in the translation of the load stage and the inner rotor along the x-axis. The fixed comb electrodes can be divided into two or more arrays of fixed combs such that they enable bi-directional translation along the x-axis.

The middle MEMS structure consists of a middle stator and a middle rotor. The middle stator comprises a base, an electrical insulating layer, an electrical connection layer, fixed combs supporting pillars, fixed comb electrodes, and a bonding frame that mechanically connects the middle MEMS structure with the rotor of the outer MEMS structure. The middle rotor holds the inner MEMS structure and consists of moving comb electrodes that are rigidly connected to each other and are attached to the middle stator via a plurality of mechanical springs. The moving comb electrodes in the middle rotor are horizontally aligned with the fixed comb electrodes in the middle stator along the x-y plane.

The mechanical springs of the middle rotor are designed to be compliant/elastic along the in-plane axis y, and highly stiff along the other axes of motion (x and z). When a voltage potential is applied across the fixed and moving comb electrodes in the middle MEMS structure, an electrostatic force develops between the electrodes which results in the translation of the middle rotor which holds the entire inner MEMS structure along the y-axis. The fixed comb electrodes in the middle stator can be divided into two or more arrays of fixed combs such that they enable bi-directional translation along the y-axis.

The outer MEMS structure consists of an outer stator and outer rotor. The outer stator comprises a base, an electrical insulating layer, an electrical connection layer, vertically protruding pillars referred to as pistons, and a bonding frame that mechanically connects the outer stator to the outer fixed periphery frame. The pistons can be electrically divided into multiple arrays through an insulating layer to provide translation motion along the z-axis and bi-axial tilt about the x and y axes. The outer rotor holds both the inner and middle MEMS structures and consists of a plurality of through holes referred to as tubes that are vertically aligned with the pistons in the outer rotor and are attached to the outer fixed periphery frame of the actuator via a plurality of mechanical springs.

The mechanical springs of the outer rotor are designed to be compliant/elastic along the out-of-plane axis (z), and highly stiff along the in-plane axes (x and y). When a voltage potential is applied across all arrays of the pistons in the outer stator and tubes in the outer rotor, electrostatic forces develop between the walls of the piston and tubes which result in the translation of the outer rotor holding the inner and middle MEMS structures along the z-axis. When the voltage is applied to only a single array of the pistons leading to a voltage differential between the wall of those pistons and the corresponding tubes in the outer rotor, an electrostatic torque is generated which leads to a tilt of the outer rotor about the x or y axis.

The present invention exhibits a number of advantages including total decoupling between the translation motion along the 3 axes (x, y, z). Decoupling between axes of motion is an important feature of the actuators that enables better performance when achieving autofocus and optical image stabilization in compact cameras. Autofocus is achieved through the translation motion of the optical element (lens or image sensor) along the optical axis (z), while the image stabilization is achieved through the in-plane translation motion of the optical element along the x and y axes. Such translations have to be to totally decoupled from each other to have a better performance in terms of achieving autofocus and optical image stabilization.

Another advantage of the present invention is the high rigidity of the moving parts (rotors) of the actuator structures. The rotors incorporate comb drives and tubes that enable the rotor to have a meshed structure. Each moving comb is supported from both ends which leads to the increase in the rigidity of the rotors to resist high acceleration shocks.

The present invention also utilizes an electrode configuration that enables large capacitive area within a compact size of the actuator to generate large forces. The number of the moving comb-drives or tubes can be multiplied along the x-y plane in each rotor as the moving combs can be considered as through holes with fingers on the sides and are thus similar to the tubes used in the outer rotor structure. Those holes can be easily multiplied across the x-y plane of each rotor.

BRIEF DESCRIPTION OF DRAWINGS

Embodiments herein will hereinafter be described in conjunction with the drawings provided to illustrate and not to limit the scope of the claims, wherein like designations denote like elements, and in which:

FIG. 1C illustrates an exploded view of FIG. 1A that shows the two wafers that the actuator is made of.

DETAILED DESCRIPTION OF THE INVENTION

Figure 1A:
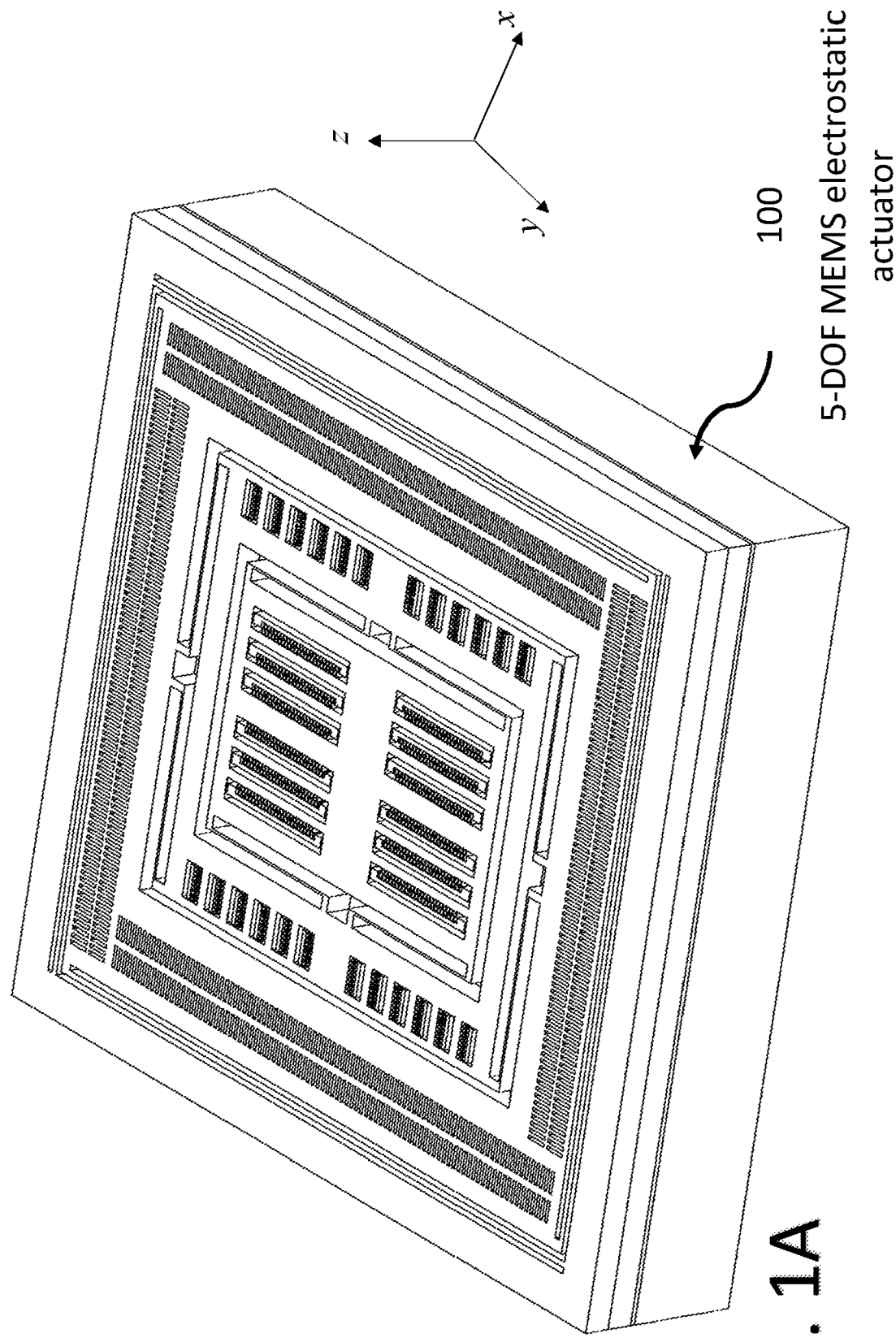
FIG. 1A shows a perspective view of the 5-DOF MEMS electrostatic actuator.
Figure 1B:
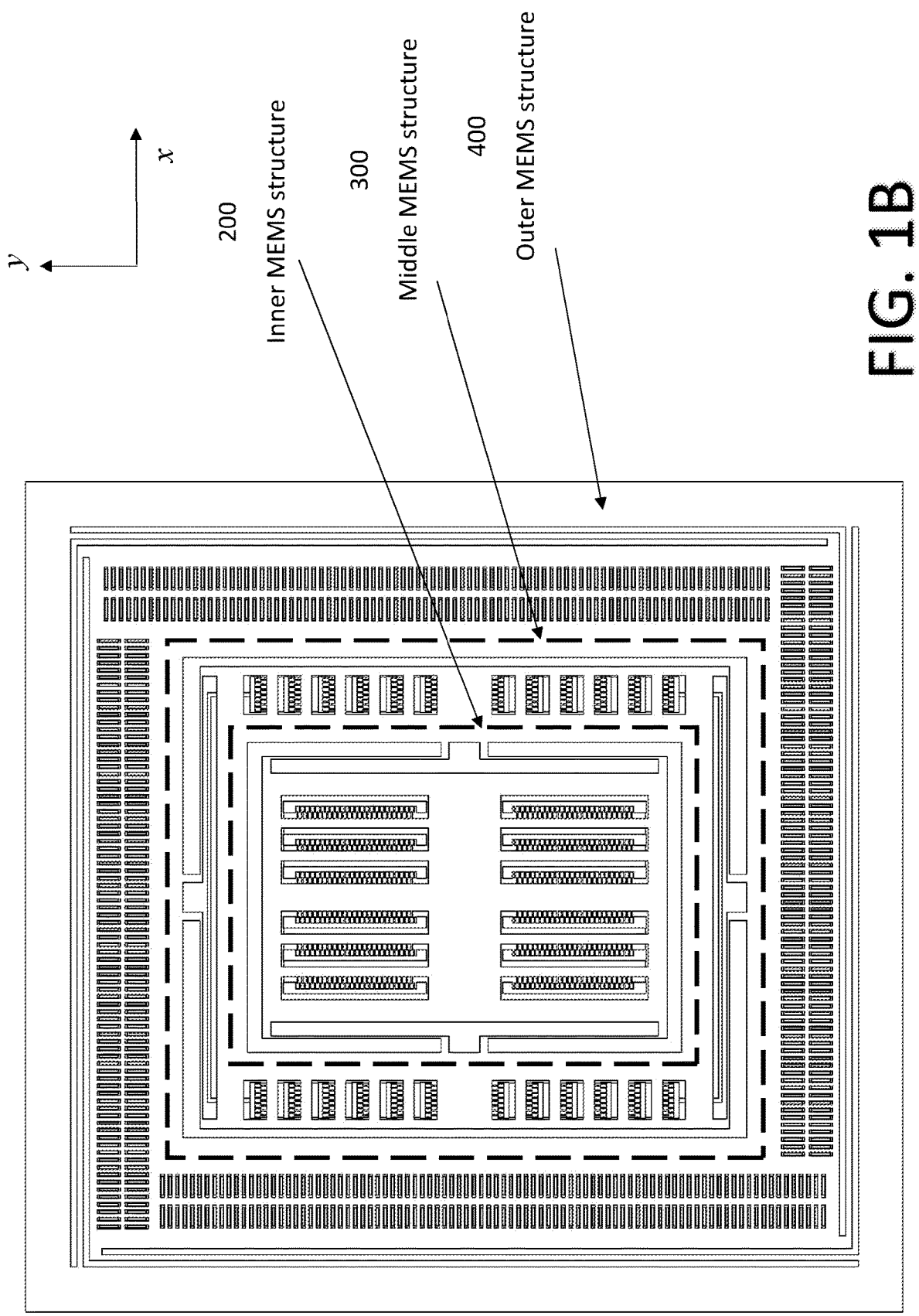
FIG. 1B illustrates a top view of the 5-DOF MEMS electrostatic actuator showing the main three inner structures of the actuator.
Figure 1C:
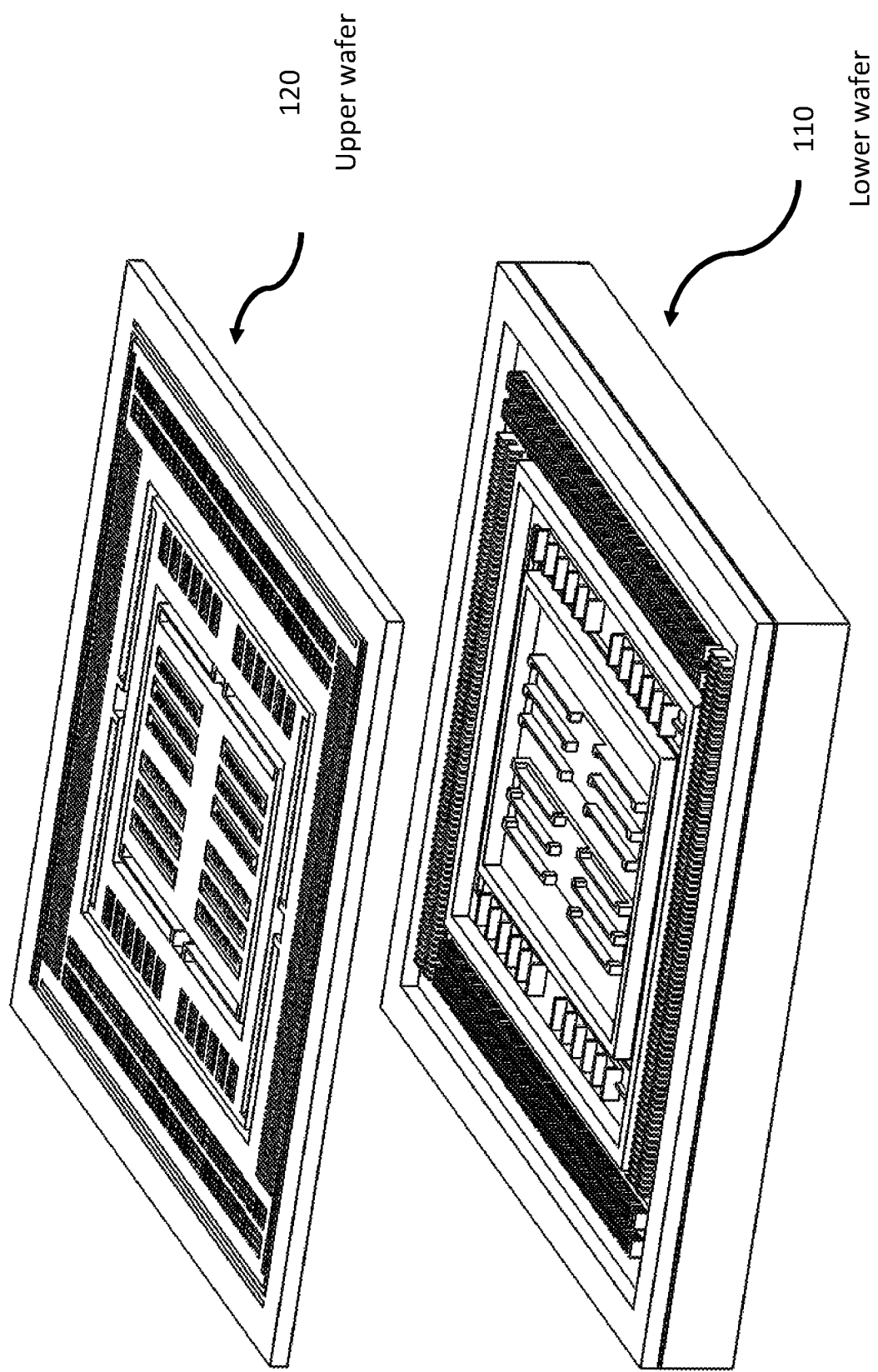
Figure 1D:
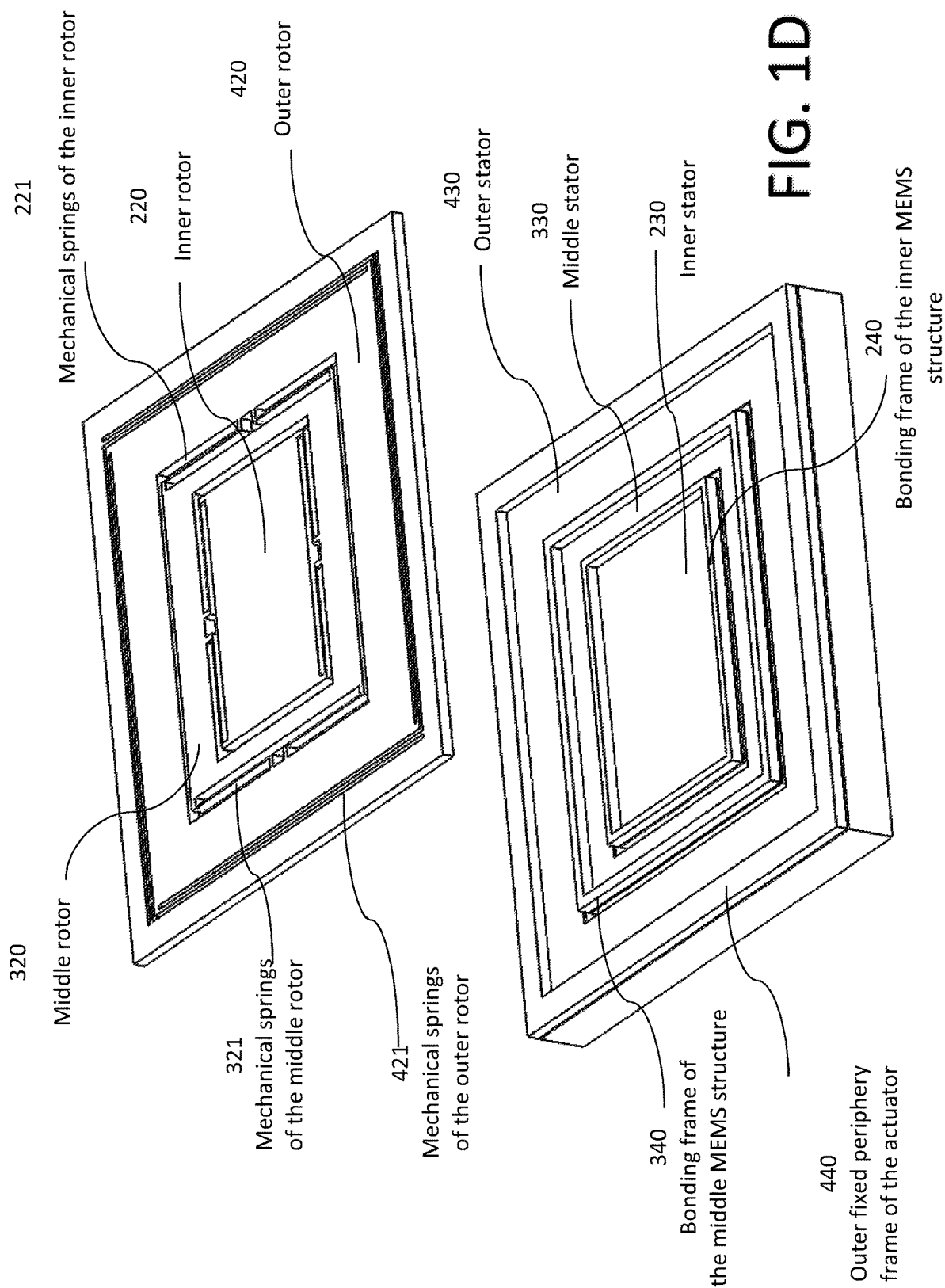
FIG. 1D illustrates an exploded view of FIG. 1A that shows the main parts of the three MEMS structures of the actuator.
Figure 1E:
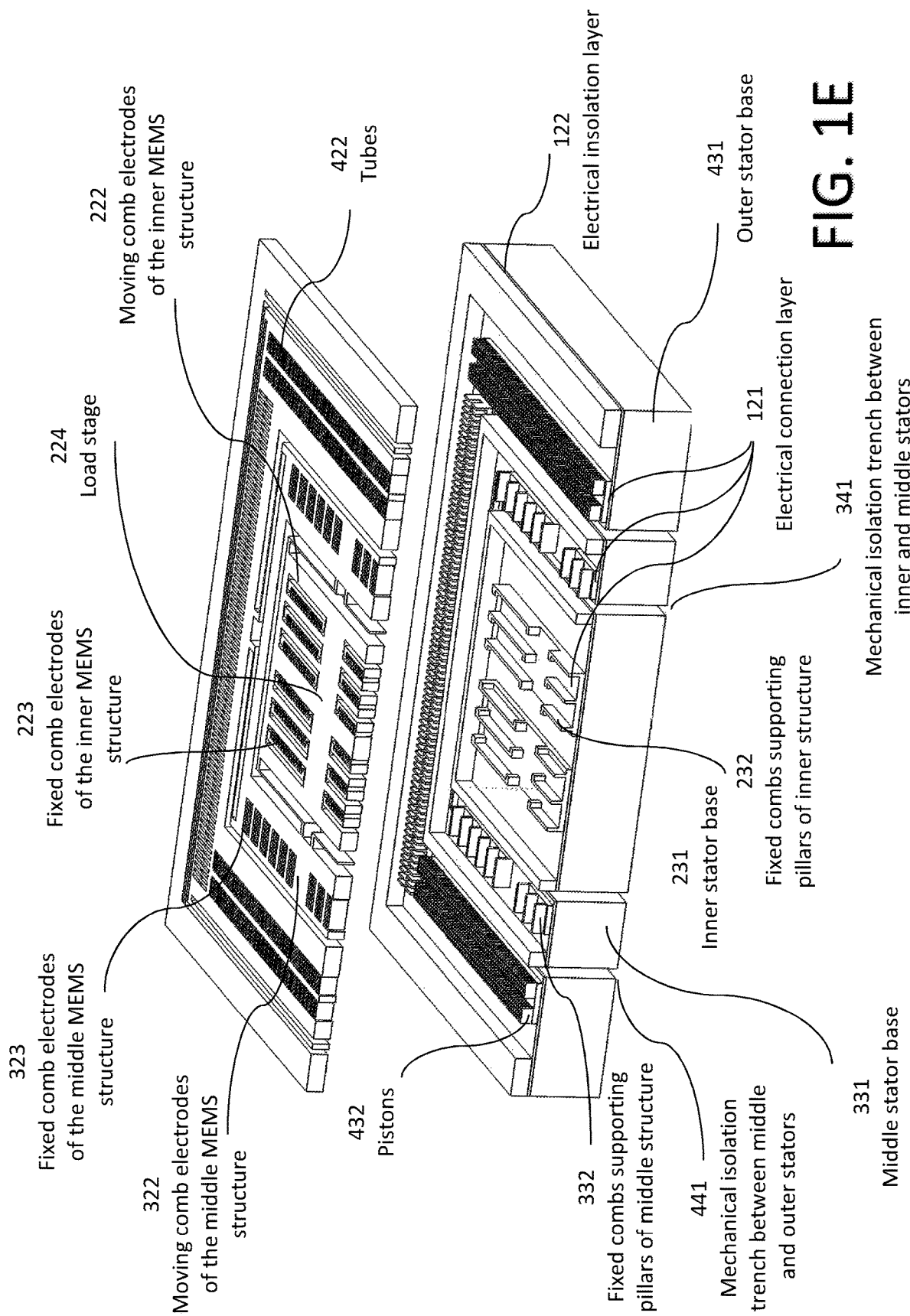
FIG. 1E shows an exploded cross-sectional view of the 5-DOF MEMS electrostatic actuator illustrating different parts of the actuator.

The present invention of the 5 DOF MEMS electrostatic microactuator 100 is illustrated in FIG. 1A-1E. The actuator mainly consists of three main MEMS structures that are nested with respect to each other, namely the inner MEMS structure 200, the middle MEMS structure 300, and the outer MEMS structure 400, see FIG. 1B. The inner MEMS structure holds the load and provides an in-plane translational motion along the x-axis. The middle MEMS structure holds the inner MEMS structure and provides an in-plane translational motion along the y-axis. The outer MEMS structure holds the middle and the inner MEMS structures and provides an out-of-plane translational motion along the z-axis, and a bi-axial tilt about the x and y axes. The three MEMS structures are interchangeable. In one embodiment of the present invention, the inner MEMS structure is responsible for providing the y-axis motion or z-axis motion, the middle MEMS structure is responsible for providing the x-axis motion or the z axis motion, and finally the outer structure is responsible for the x-axis or y axis motion.

The actuator is fabricated through the bonding of two silicon wafers: lower 110 and upper 120. The lower wafer is preferably Silicon on Insulator (SOI) wafer that has an oxide layer within its thickness to provide an electrical insulation between various electrodes of the actuator. The top wafer is a standard silicon wafer. Both wafers form various parts of the actuator including moving and fixed parts. In other embodiments of the present invention, the actuator can be fabricated using any other metal or semiconductor material.

The inner MEMS structure 200 is illustrated in FIG. 1D-E and FIG. 2A-C. It comprises an inner stator 230 and inner rotor 220, refer to FIG. 1D. The inner stator, illustrated in FIG. 2B, comprises a stator base 231, an electrically insulating layer 122, an electrical connection layer 121, an array of fixed comb electrodes 223, fixed combs supporting pillars 232, and a bonding frame 240 that mechanically connects the inner MEMS structure with the rotor of the middle MEMS structure. The inner rotor 220 comprises a load stage 224, through holes 225 with moving comb fingers 222 protruding along the x-y plane from the walls of the said through holes. Walls of the through holes are rigidly connected to each other and are attached to the inner stator via a plurality of mechanical springs 221. The moving comb fingers in the inner rotor are aligned with the fixed comb electrodes along the x-y plane in the inner stator along the x-axis.

The fixed combs' supporting pillars are used to hold the fixed combs aligned along the x-y plane with the moving combs in the rotor and to provide an electrical routing to the fixed combs. The array of the fixed comb electrodes in the inner stator can be grouped into one or more sub-arrays of electrodes, where the fixed comb electrodes in each group are electrically connected through a thin layer of silicon-connection layer 121, and jointly form a single sub stator. The electrically insulating layer 122 is utilized to provide an electrical insulation between the individual sub stators. Ideally the arrays shall be grouped into two sub-arrays of fixed comb electrodes—two sub stators—to enable a bi-directional translational motion along the in-plane axis (x). If only one array of fixed comb electrodes is formed, the inner rotor will move in a unidirectional motion either along the positive or negative direction of the x-axis.

When the inner stator is divided into only two sub stators, the fingers of the fixed combs in one sub stator will be extending in an opposite direction to the fixed combs in the other sub stator. This is to enable the bi-directional motion of the rotor.

The insulating layer can be the oxide layer within the thickness of the SOI wafer and the electrical insulation between different silicon regions can be done through a trench using a Deep Reactive Ion Etching (DRIE) of the device layer which will isolate different Si regions in the stator layer. The thin layer of silicon could be formed using deep Reactive Ion Etching (DRIE) of the device layer such that a thin layer of silicon is left above the oxide layer of the SOI wafer and electrically connects between the fixed combs supporting pillars. The electrical routing for the inner sub stator to the outside circuitry could be done through wire-bonding directly on electrical pads that may be created on the topside of the fixed combs.

The inner rotor structure exhibits high rigidity as it contains through holes with moving fingers extending from the walls of these holes. Such holes/openings make the rotor structure well connected and rigid to absorb any shock forces that the actuator may experience. It also prevents deformations within the structure of the rotor such that the electrostatic forces are directly applied to any load placed on the load stage. Mechanical springs holds the inner rotor could be of any designs—crab leg, serpentine, folded springs etc.—such that they are compliant along the axis of the motion (x in this case) and highly stiff along the other axes (y and z).

Figure 2A:
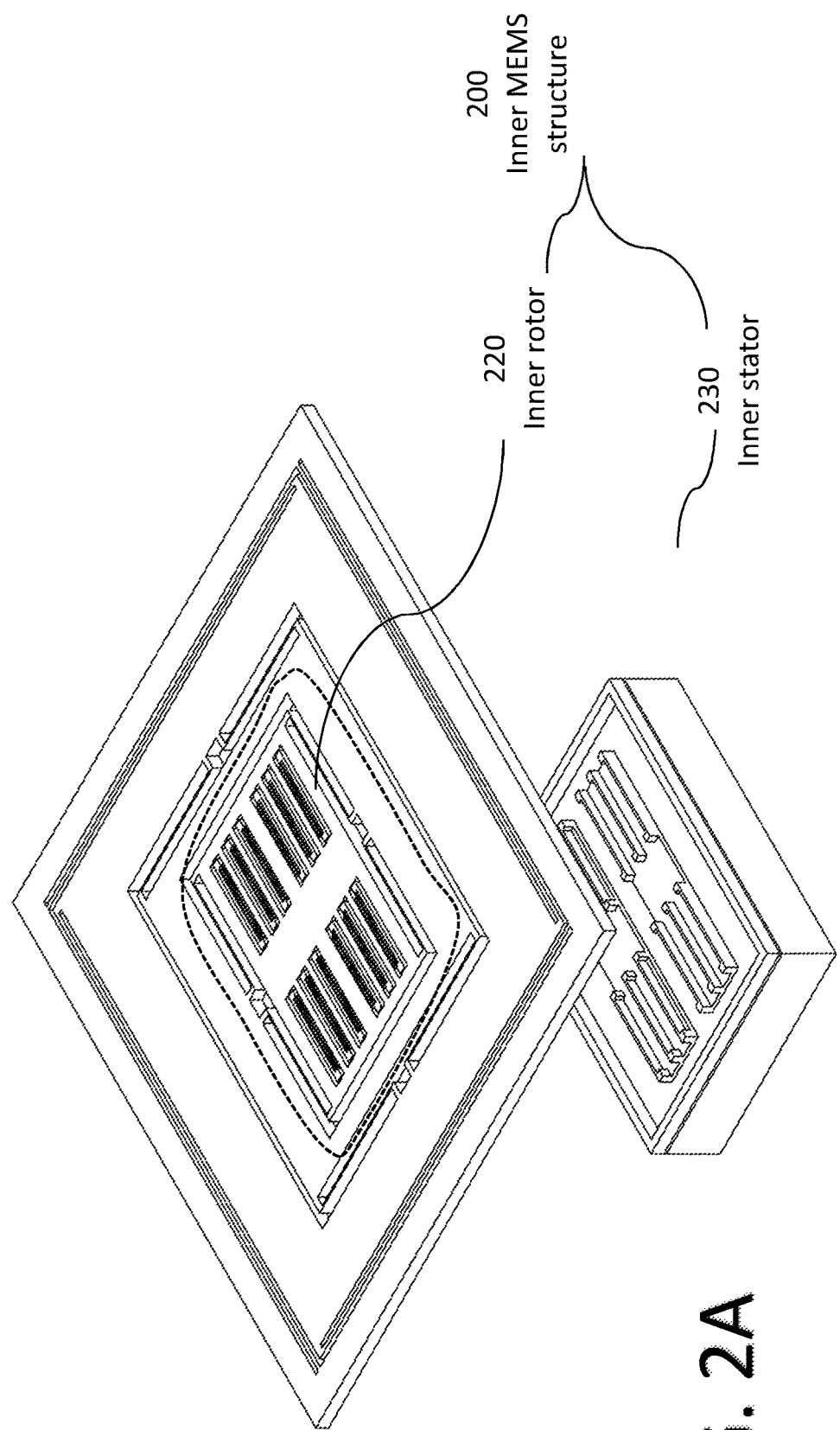
FIG. 2A shows an exploded view of the inner MEMS structure of the actuator illustrating the inner rotor and the stator.
Figure 2B:
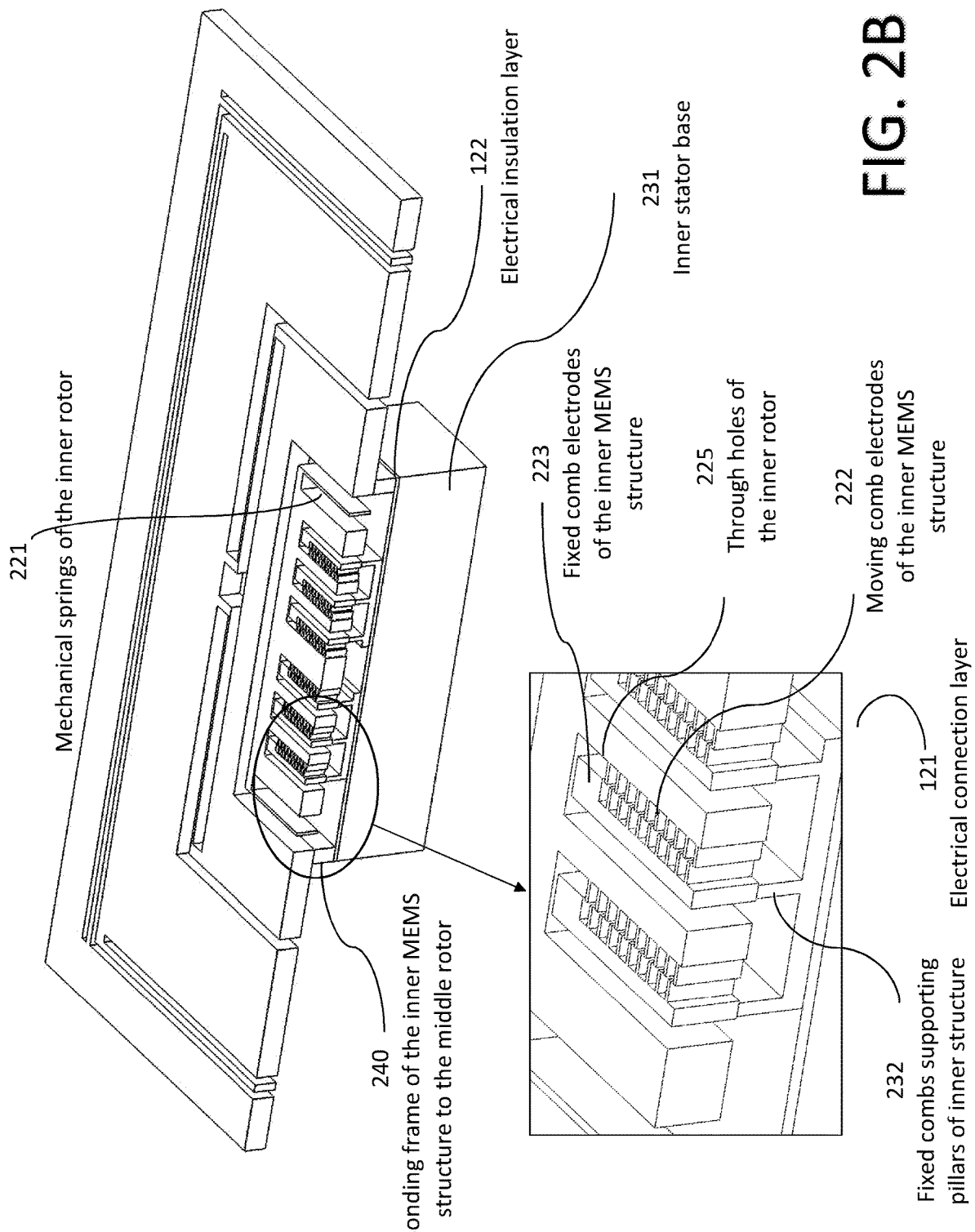
FIG. 2B shows a cross-sectional view of the inner MEMS structure of the actuator illustrating various parts of the inner rotor and the stator.
Figure 2C:
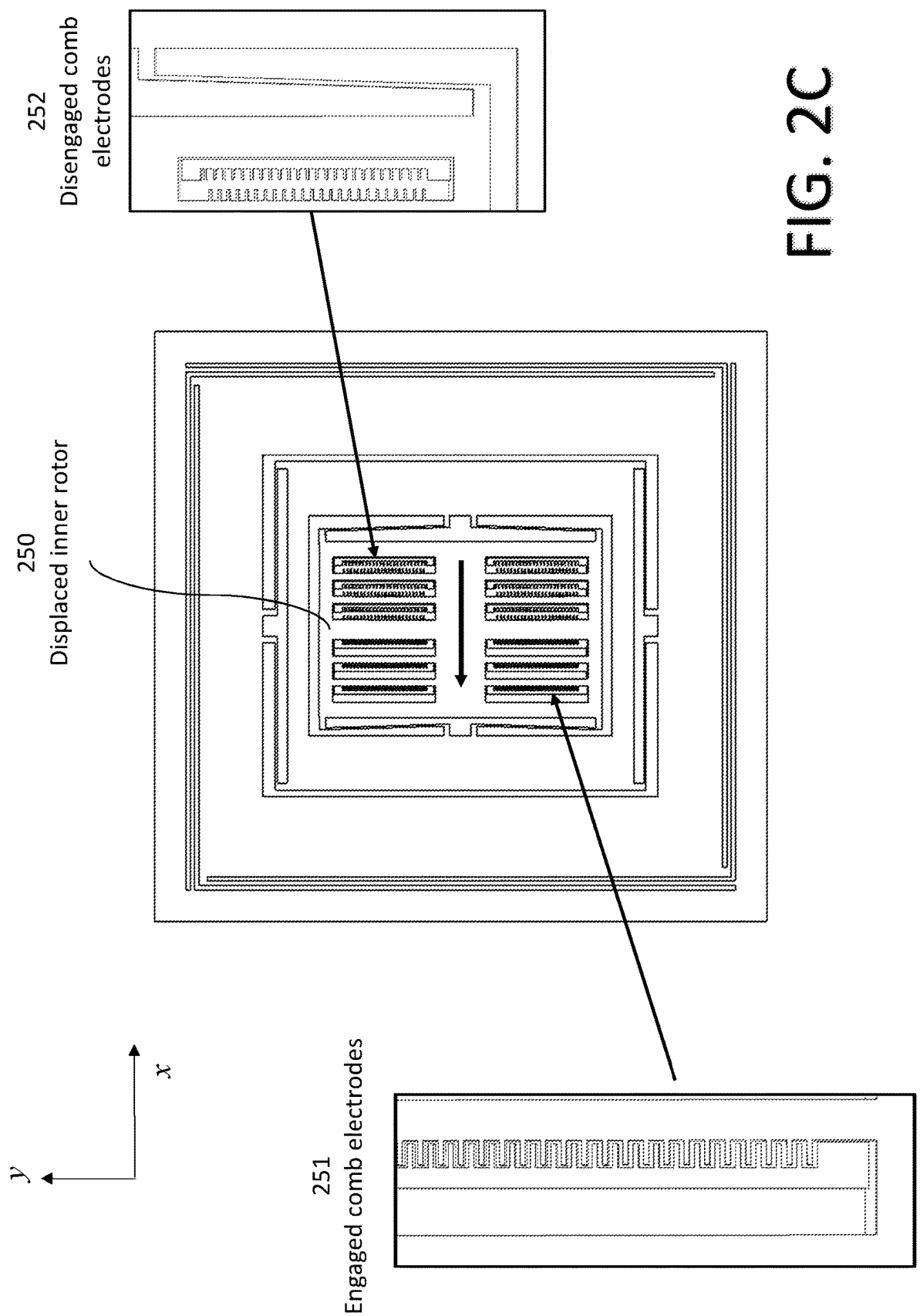
FIG. 2C is a top view illustrating the translation motion of the inner rotor along the x-axis when a voltage is applied between the comb-drive electrodes in the inner MEMS structure.

When a voltage signal is applied across the inner rotor (common electrode) and one or more of the inner sub stators, electrostatic forces are developed between the fingers of the moving and fixed combs pushing the inner rotor in the direction of the activated sub stators. FIG. 2C shows the inner rotor in translation motion 250 towards the activated sub stator (on the left side of the rotor shown in the figure). The comb fingers of the inner rotor and the activated sub stator engage 251 during the motion, while the comb fingers of the inner rotor and the passive sub stator disengage 252.

Figure 3A:
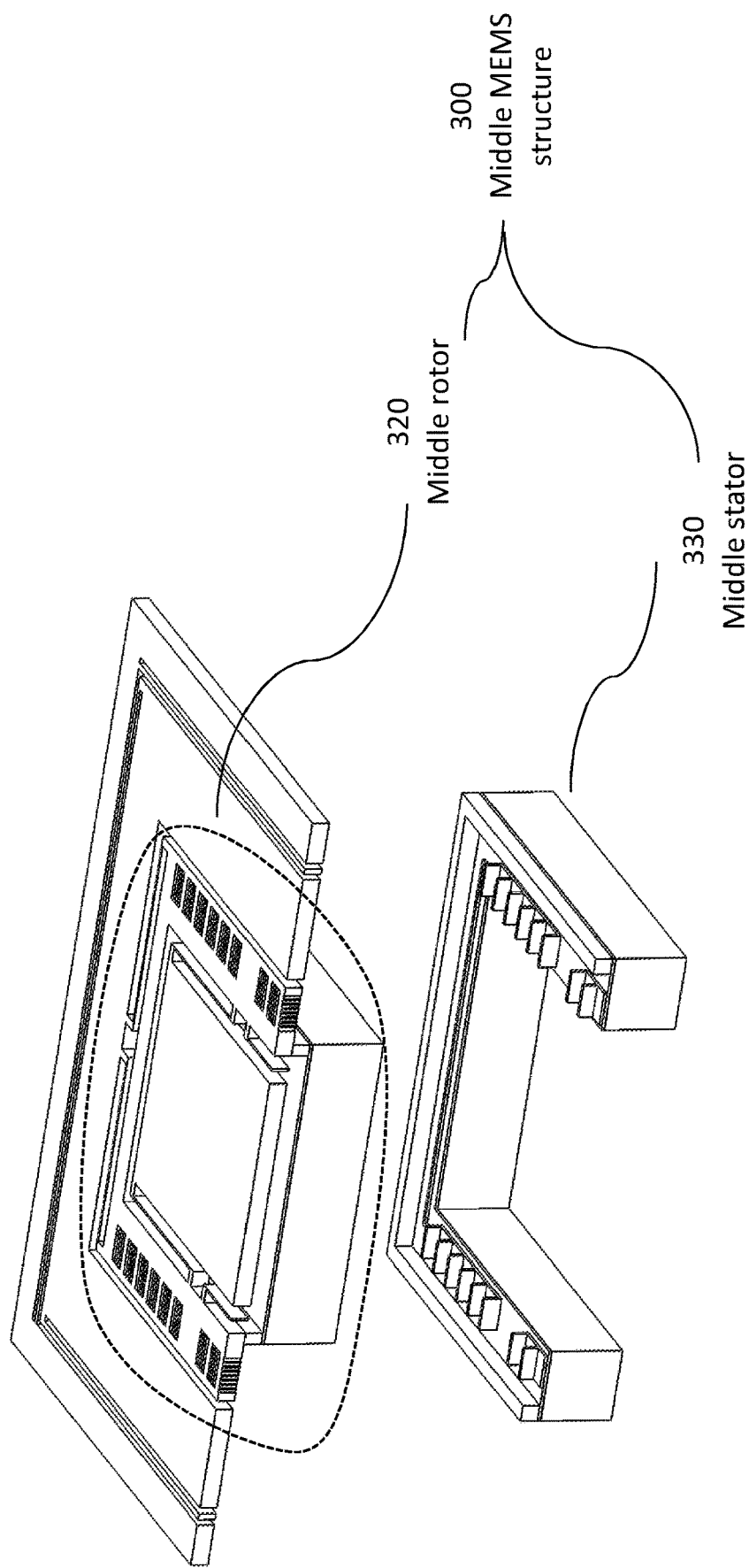
FIG. 3A shows an exploded view of the middle MEMS structure of the actuator illustrating the middle rotor and stator.
Figure 3B:
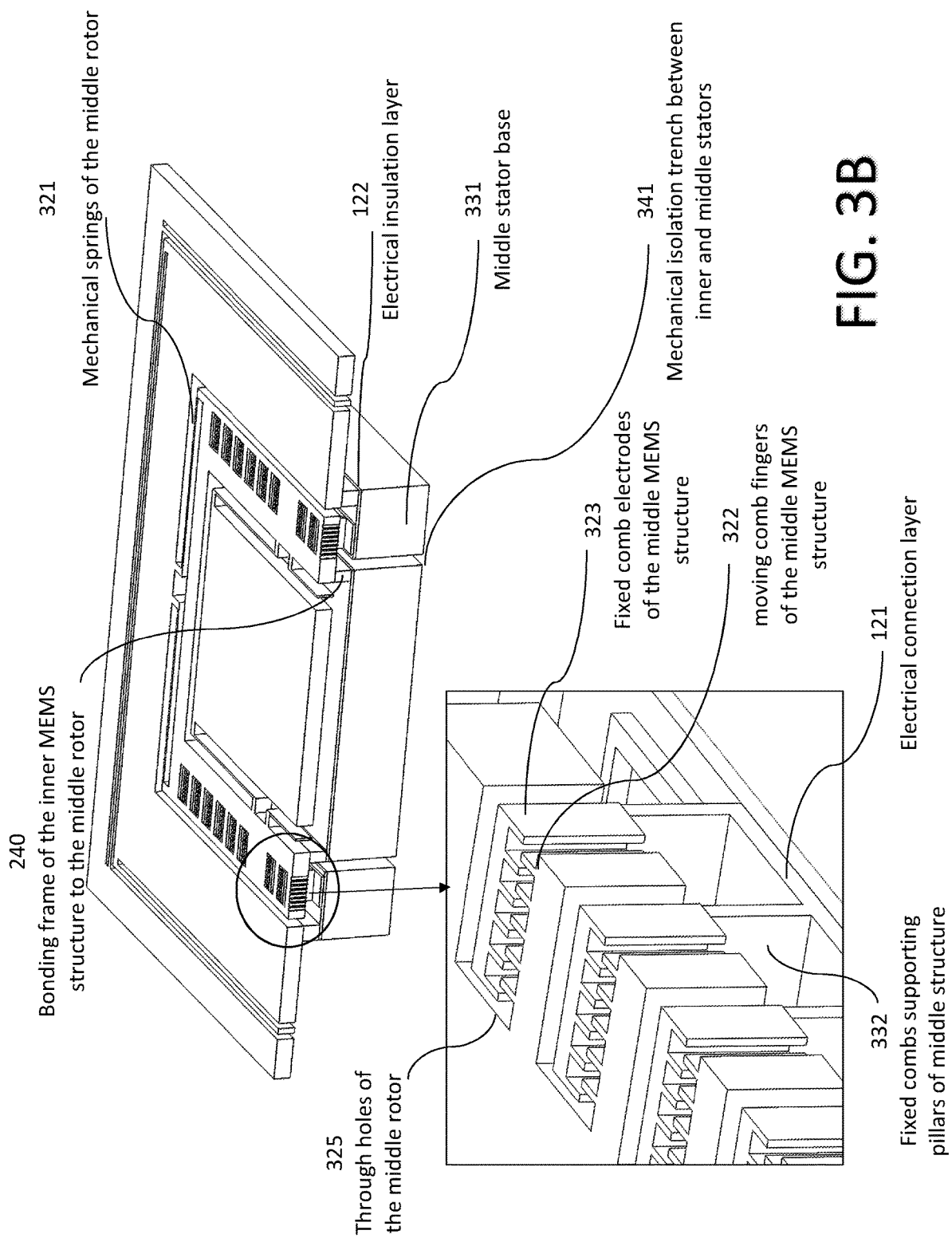
FIG. 3B shows a cross-sectional view of the middle MEMS structure of the actuator illustrating various parts of the middle rotor and stator.

The inner MEMS structure is rigidly attached to the middle rotor of the middle MEMS structure through the inner bonding frame 240, refer to FIG. 3B, and mechanically isolated from the stator of the middle MEMS structure through trenches 341. Such mechanical connection/attachment—between the inner MEMS structure and middle rotor—and mechanical isolation between the inner MEMS structure and middle stator enable the total decoupling between the motions in both inner and middle MEMS structures. That is because the inner MEMS structure (holding the target load) is considered a load that is rigidly attached to the middle rotor; any motion within the inner MEMS structure is therefore affected by the motion of the middle rotor and vice versa.

The middle MEMS structure 300 is illustrated in FIG. 1D-E and FIG. 3A-C. It comprises middle stator 330 and middle rotor 320, refer to FIG. 3A. The middle stator, clearly illustrated in FIG. 3B, comprises a stator base 331, the electrical insulation layer 122, the electrical connection layer 121, an array of fixed comb electrodes 323, fixed combs supporting pillars 332, and a bonding frame 240 that mechanically connects the inner MEMS structure with the rotor of the middle MEMS structure. Similar to the inner rotor design, the middle rotor 320 comprises a plurality of through holes 325 with moving comb fingers 322 protruding along the x-y plane from the walls of the said through holes. Walls of the through holes form one body (i.e. are formed from the same wafer) and are attached to the middle stators via a plurality of mechanical springs 321. The moving comb fingers in the middle rotor are aligned along the x-y plane with the fixed comb electrodes in the middle stator along the y-axis.

The fixed combs supporting pillars 332 are used to hold the fixed combs in the middle stator aligned along the x-y plane with the moving combs in the middle rotor and to provide an electrical routing to the fixed combs in the middle stator. The array of the fixed comb electrodes in the middle stator can be grouped into one or more sub-arrays of fixed comb electrodes, where the fixed comb electrodes in each group are electrically connected through a thin layer of silicon-connection layer 121- and jointly form a single sub stator. The electrically insulating layer 122 is utilized to provide an electrical insulation between the individual sub stators. Ideally, the arrays shall be grouped into two sub-arrays of fixed comb electrodes—two sub stators—to enable bi-directional translation motion along the in-plane axis (y). If only one array of fixed comb electrodes (one stator) is formed, the middle rotor will move in a unidirectional motion either along the positive or negative direction of the y-axis.

When the middle stator is divided into two sub stators, the fingers of the fixed combs in one sub stator will be extending in an opposite direction to the fixed combs in the other sub stator. This is to enable the bi-directional motion of the middle rotor.

As the middle of the rotor of the middle MEMS structure holds the entire inner MEMS structure along with the load placed on it, the mechanical springs that holds the middle rotor to the outside MEMS structure have to be stiffer than the inner rotor springs along the axis of motion as the load size (target load combined with inner structure mass) is larger. This is to ensure a similar dynamic performance for both inner and middle rotors.

Similar to the inner rotor, the middle rotor structure exhibits high rigidly as it contains through holes with moving fingers extending from the walls of these holes. Such holes/openings make the structure robust and rigid to absorb any shock forces that the actuator may experience. It also prevents deformations within the structure of the rotor such that the electrostatic forces are directly applied to any load placed on the load stage.

Figure 3C:
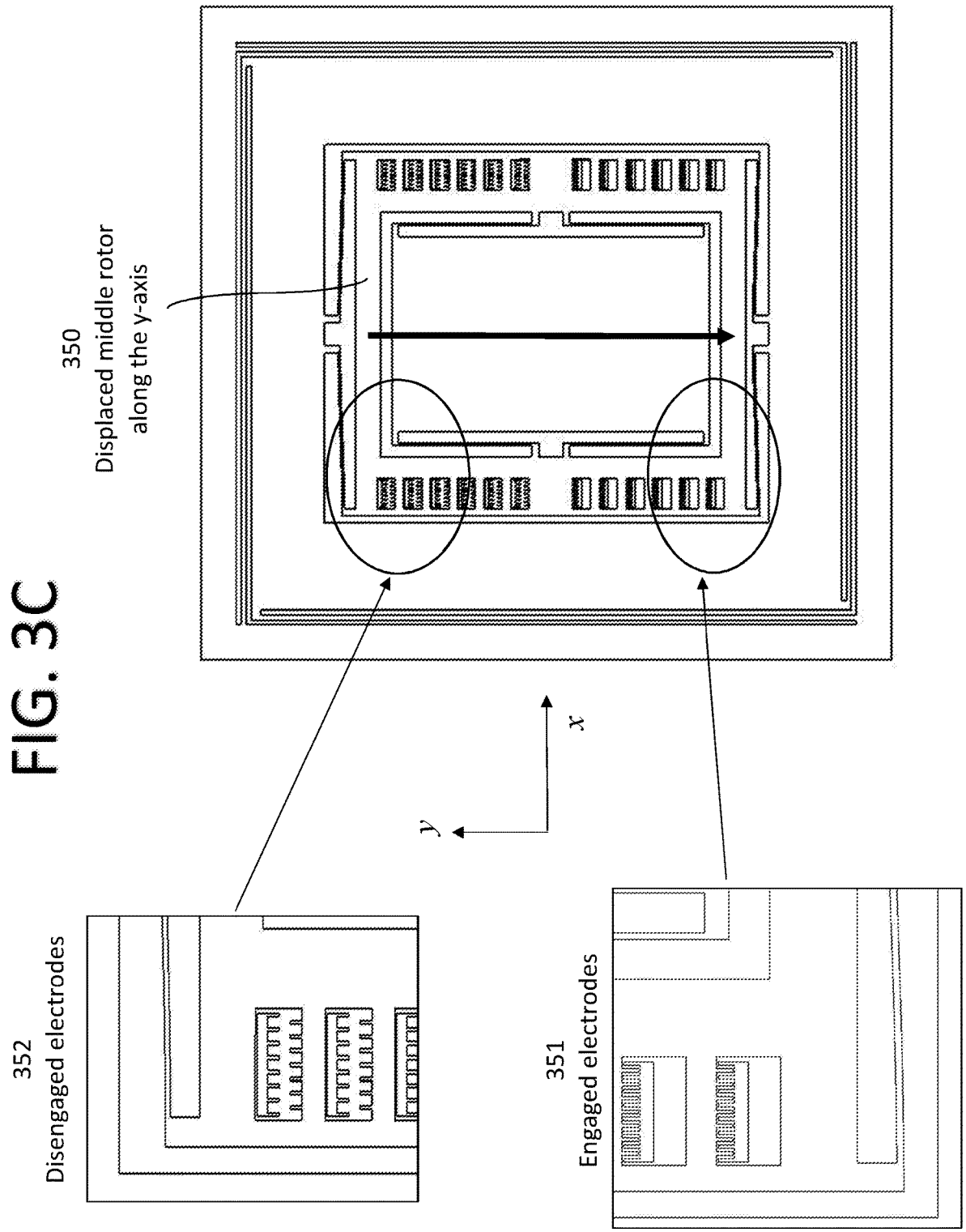
FIG. 3C is a top view illustrating the translation motion of the middle rotor along the y-axis when a voltage is applied between the comb-drive electrodes in the middle MEMS structure.

When a voltage signal is applied across the middle rotor (common electrode as all of the three rotors have the same polarity) and one of the middle sub stators, electrostatic forces are developed between the fingers of the moving and fixed combs pushing the middle rotor in the direction of that activated middle sub stator. FIG. 3C shows the middle rotor in translation motion 350 towards the activated sub stator (shown on the upper half of the middle MEMS structure in the FIG. 3C). The comb fingers of the middle rotor and the activated middle sub stator engage 351 during the motion, while the comb fingers of the middle rotor and the passive sub stator disengage 352.

The outer MEMS structure 400 is illustrated in FIG. 1D-E and FIG. 4A-C. It comprises an outer stator 430 and outer rotor 420, refer to FIG. 4A. The outer stator, clearly illustrated in FIG. 4B, comprises a stator base 431, the electrically insulating layer 122, the electrical connection layer 121, an array of pistons 432 that protrude vertically-along the z axis- and a bonding frame 440 that mechanically connects the outer MEMS structure with the outer fixed periphery frame 441 of the actuator. The outer rotor 420 comprises a plurality of through holes 422 formed along the axis z- and referred to as tubes. The walls of the tubes are rigidly connected to each other and are attached to the outer fixed periphery frame 441 via a plurality of mechanical springs 421. The tubes in the outer rotor are vertically aligned with the pistons in the outer stator along the z-axis.

The pistons in the outer stator can be grouped into one or more sub-arrays of pistons, where pistons in each sub-array are electrically connected through a thin layer of silicon-connection layer 121- and jointly form a single sub stator. The electrically insulating layer 122 is utilized to provide an electrical insulation between the individual sub stators. Ideally, the arrays of pistons shall be grouped into four sub-arrays of fixed comb electrodes—four sub stators—to enable bi-axial tilt motion about the in-plane axes (x and y).

Similar to the inner and middle rotors, the outer rotor structure exhibits high rigidly as it contains through holes (tubes) that make the structure sturdy and rigid to absorb any shock forces that the actuator may experience. It also prevents deformations within the structure of the rotor such that the electrostatic forces are directly applied to any load placed on the rotor.

Figure 4A:
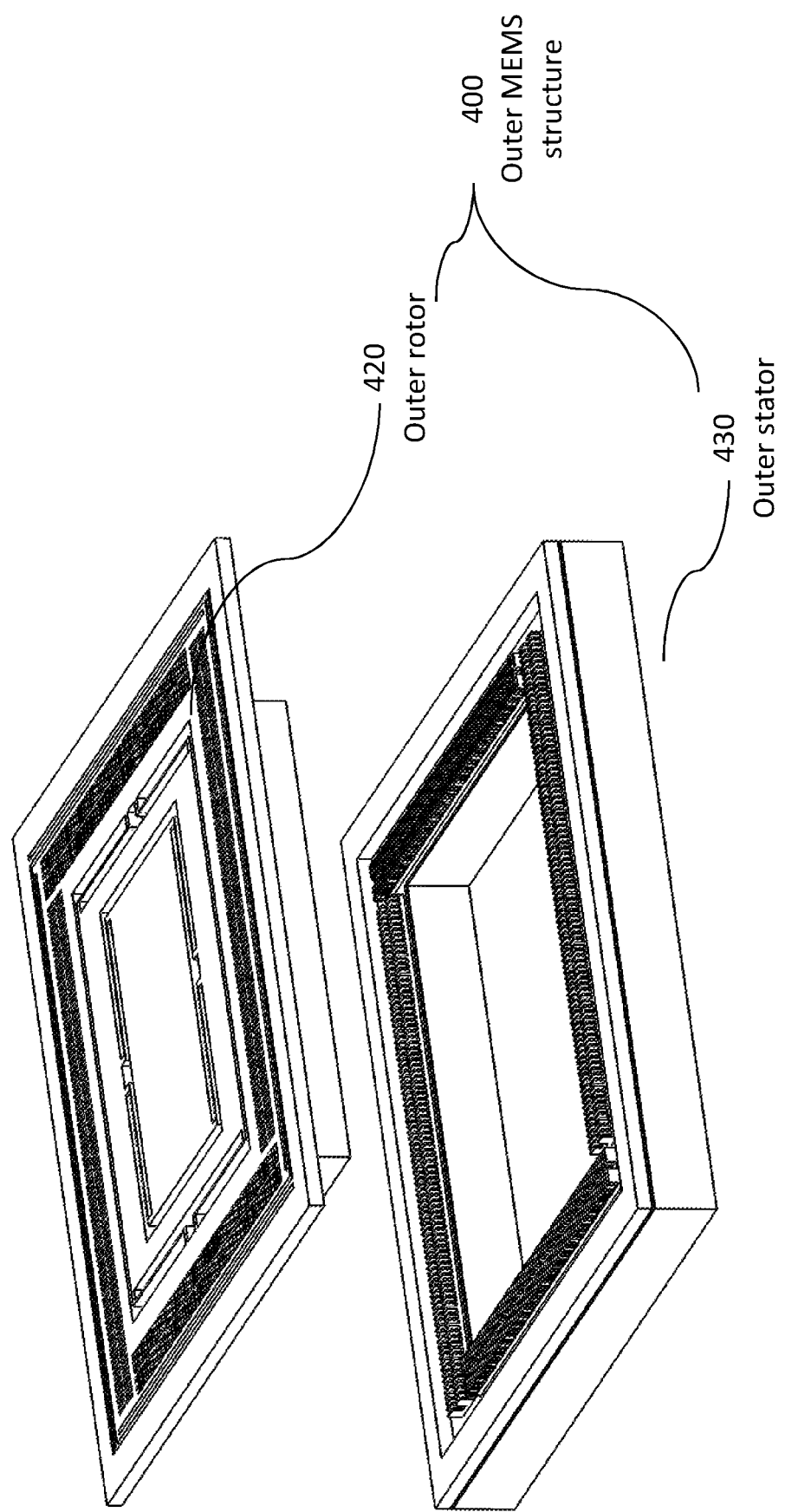
FIG. 4A shows an exploded view of the outer MEMS structure of the actuator illustrating the outer rotor and stator.
Figure 4B:
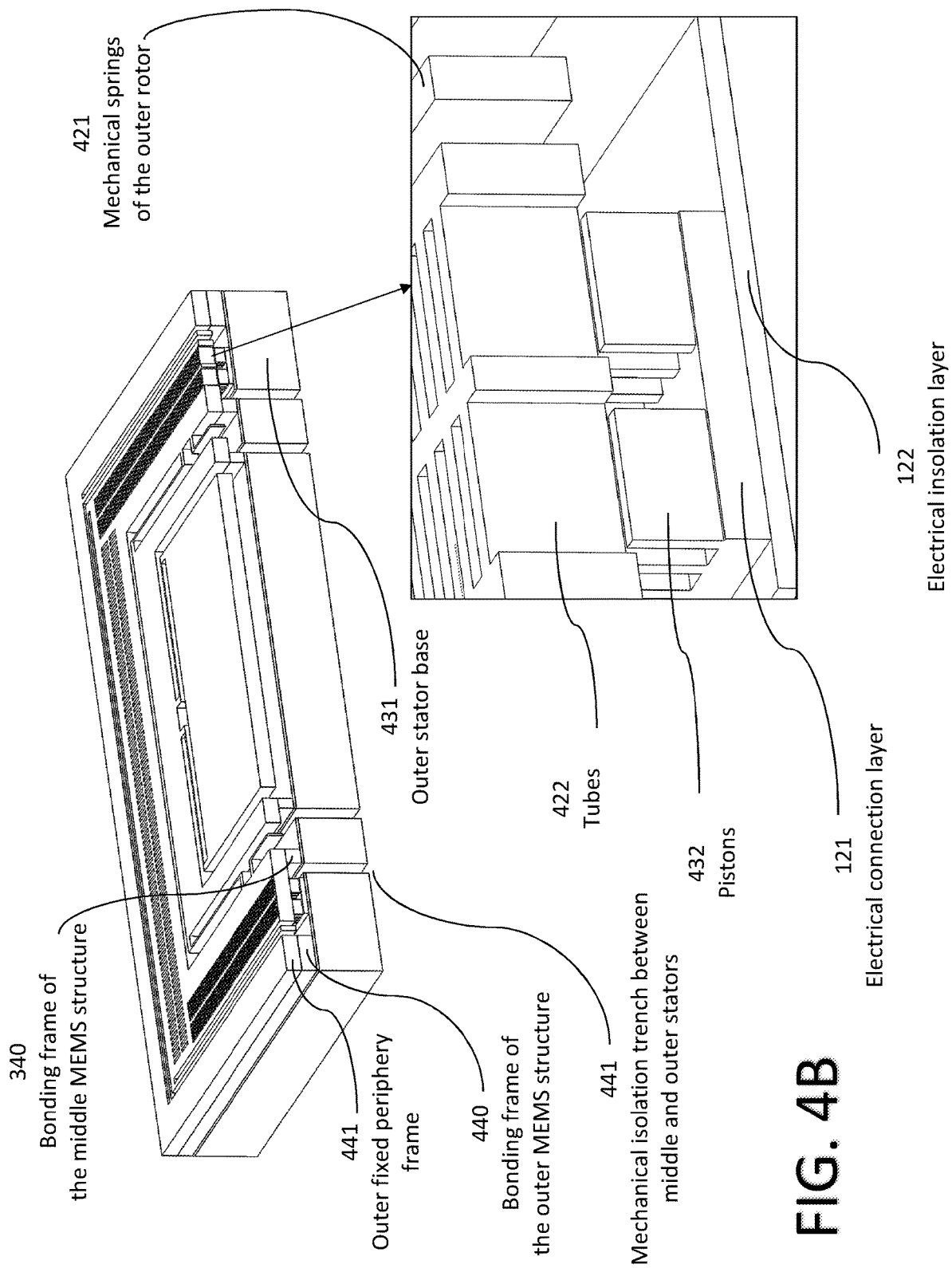
FIG. 4B shows a cross-sectional view of the outer MEMS structure of the actuator illustrating various parts of the outer rotor and stator.
Figure 4C:
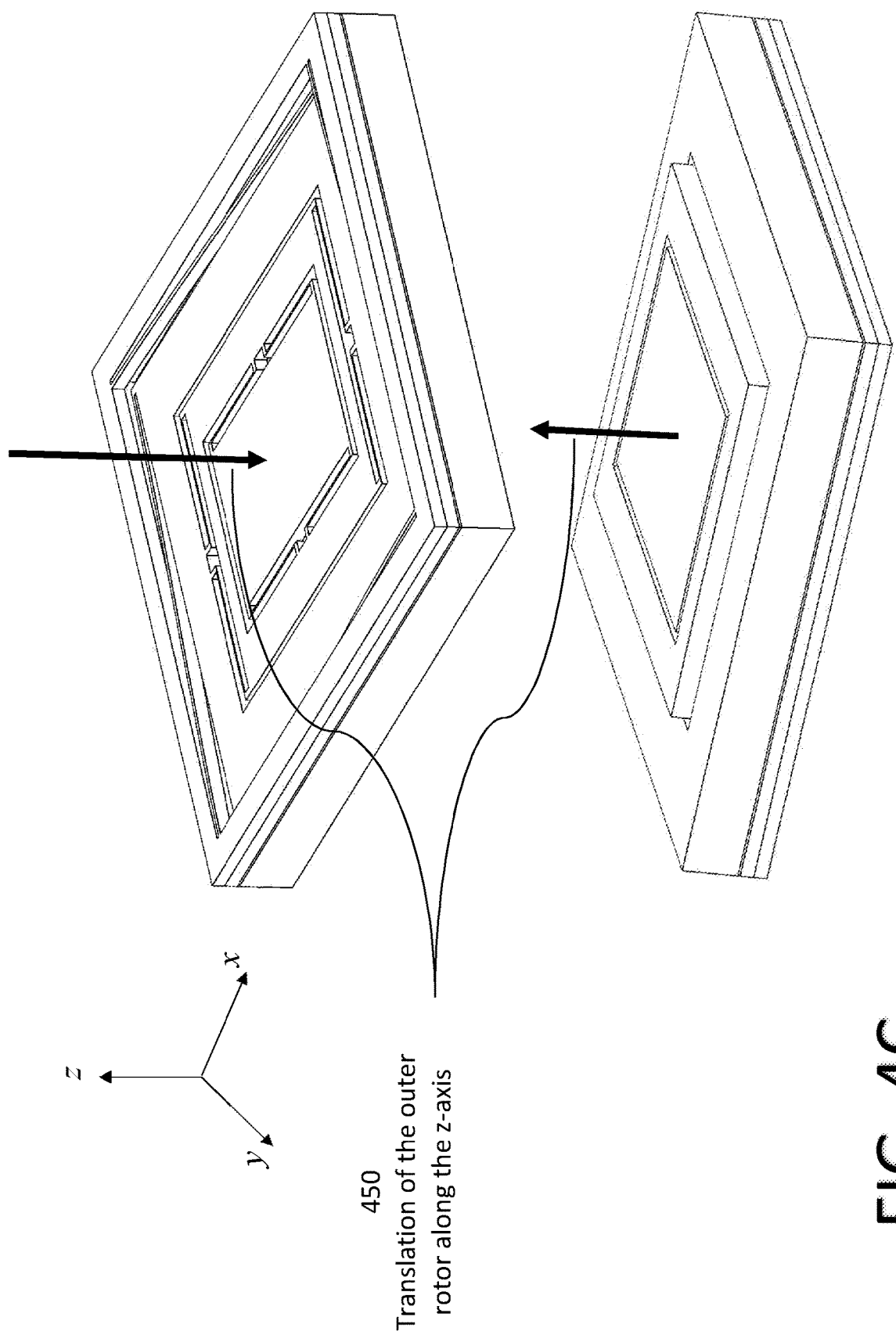
FIG. 4C is a front and back perspective view illustrating the translation motion of the outer rotor along the z-axis when a voltage is applied between the pistons and tubes in the outer MEMS structure.

The middle MEMS structure is, in turn, rigidly attached to the outer rotor of the outer MEMS structure through the middle bonding frame 340, refer to FIG. 4B, and mechanically isolated from the stator of the outer MEMS structure through trenches 441. Such mechanical connection/attachment—between the middle MEMS structure and outer rotor of the outer MEMS structure- and mechanical isolation between the middle MEMS structure and outer stator enable the total decoupling between the motions in both middle and outer MEMS structures. That is because the middle MEMS structure (holding the inner MEMS structure and target load) is considered as a load that is rigidly attached to the outer rotor; any motions within the inner and middle MEMS structures are, therefore, not affected by the motion of the outer rotor and vice versa.

Figure 4D:
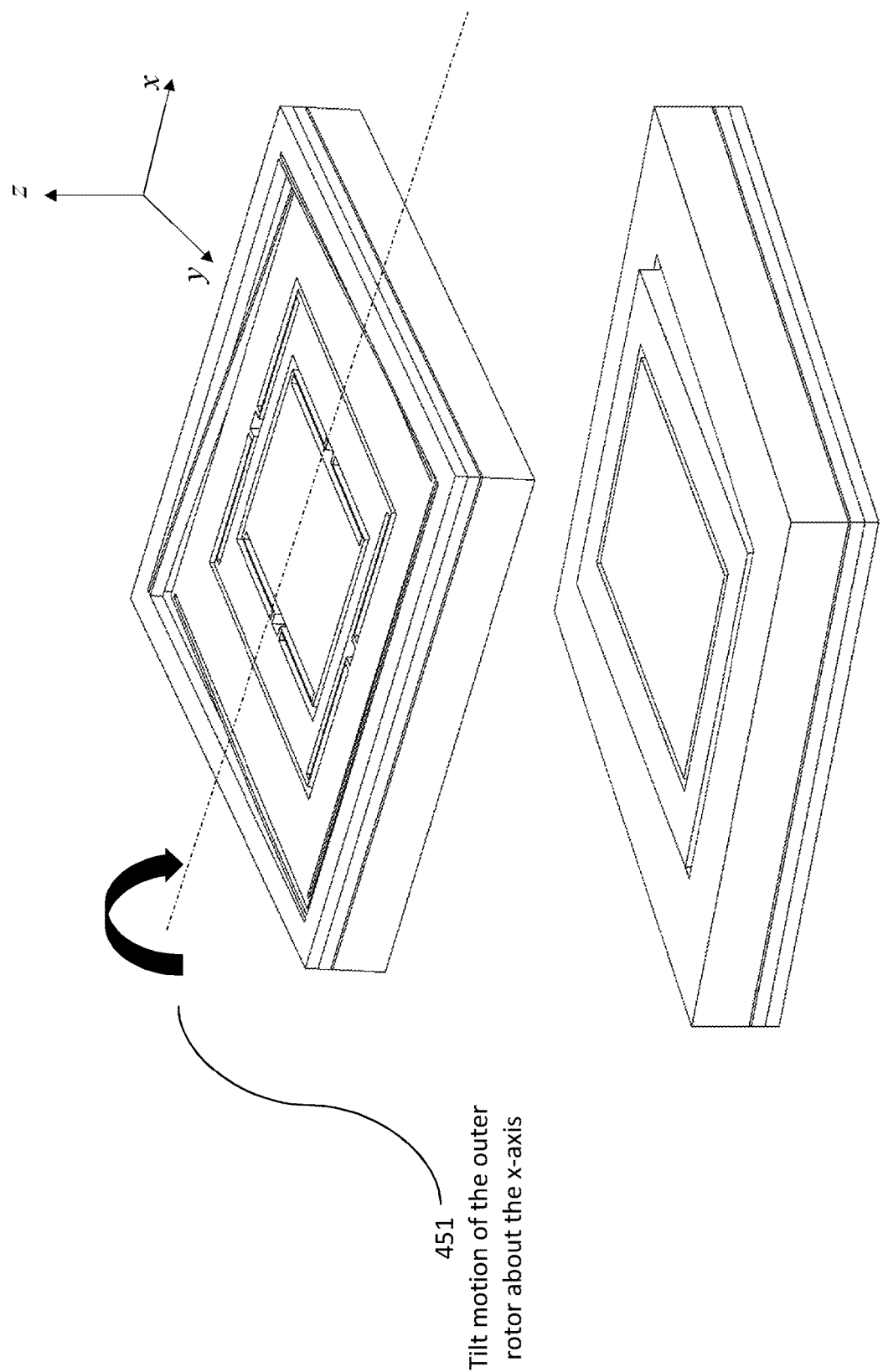
FIG. 4D is a front and back perspective view illustrating the tilt motion of the outer rotor about the x-axis when a voltage is applied between a single array of pistons and tubes in the outer MEMS structure.
Figure 4E:
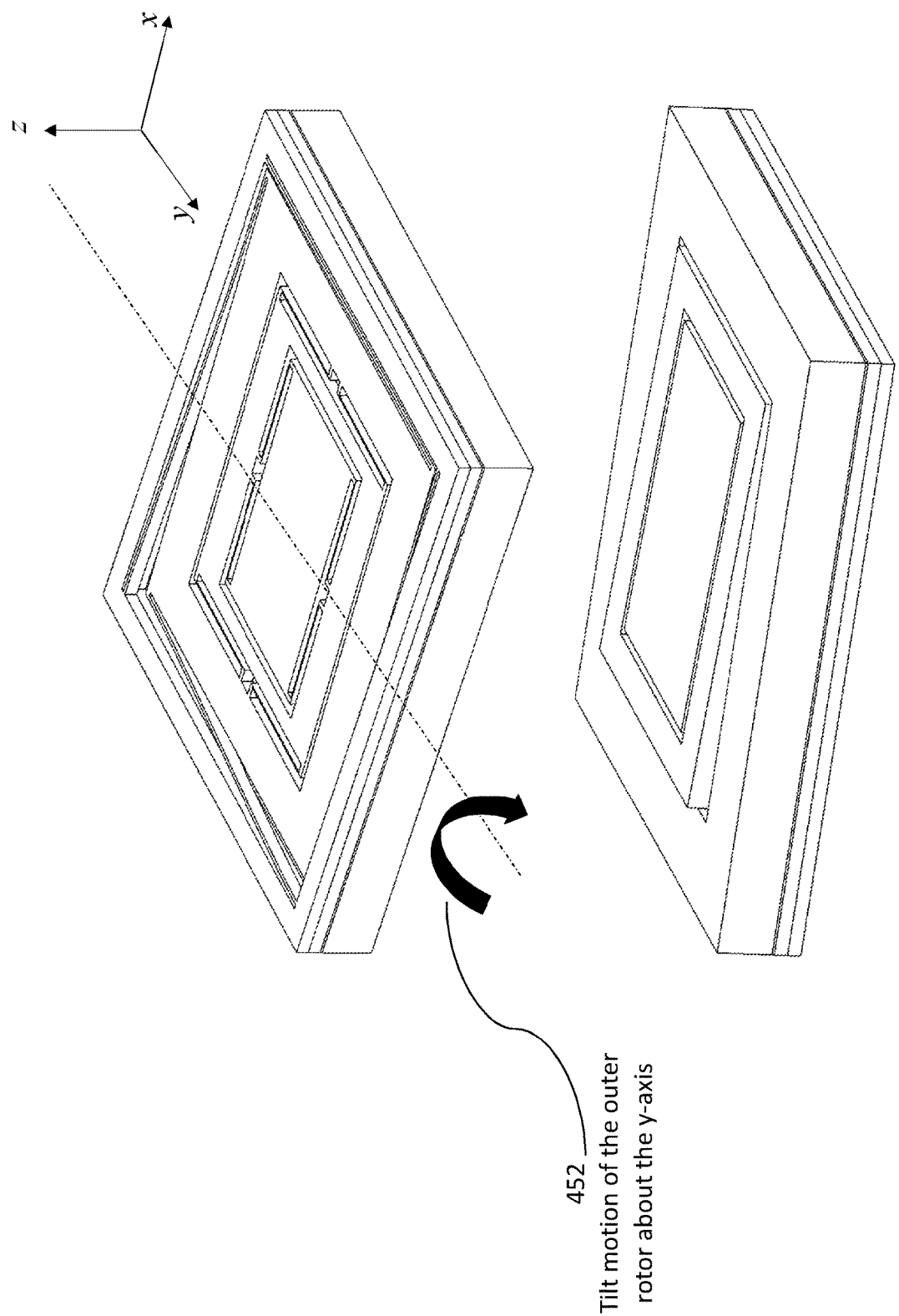
FIG. 4E is a front and back perspective view illustrating the tilt motion of the outer rotor about the y-axis when a voltage is applied between a single array of pistons and tubes in the outer MEMS structure.

When a voltage is applied across all/some of the outer sub stators and the outer rotor, an electrostatic force/torque is generated between the inner walls of the tubes in the outer rotor and the walls of the pistons in the outer stators. This force or torque drives the outer rotor (holding the entire middle and inner MEMS structures along with the target load) in a 3-DOF motion, i.e. translation along the z-axis 450, refer to FIG. 4C, tilt about the x-axis 451, refer to FIG. 4D, and tilt about the y-axis 452, refer to FIG. 4E.

Figure 5:
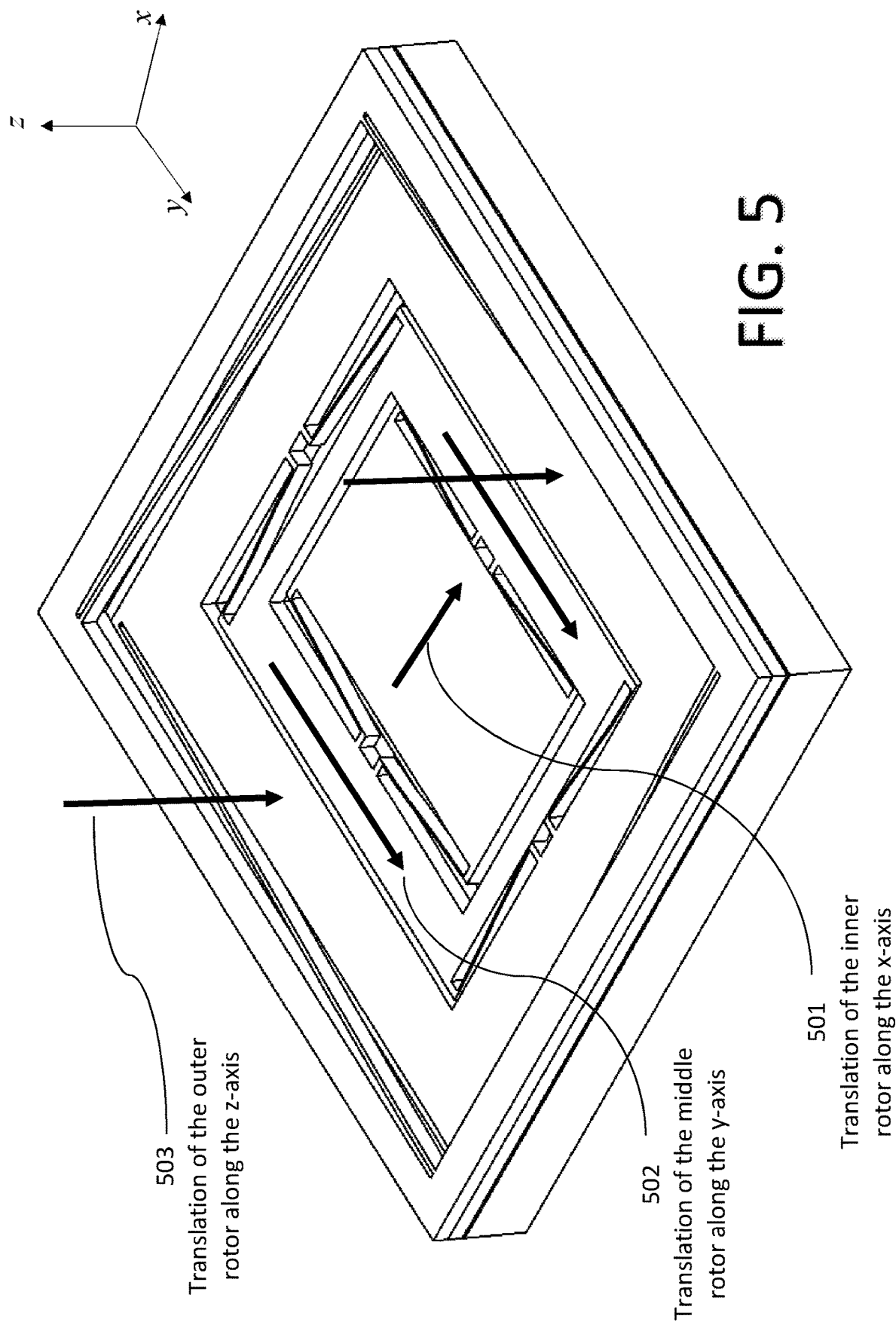
FIG. 5 is a perspective view of the 5-DOF MEMS electrostatic actuator illustrating the three translation motions provided by the three MEMS structures along the x, y, and z axes.

As a result, the target load on the load stage of the inner MEMS structure experiences 5-DOF motion that are provided by the actuator, refer to FIG. 5: a translation motion along the x-axis 501 provided by the inner MEMS structure, a translation motion along the y-axis 502 provided by the middle MEMS structure and 3 motions (translation along the z-axis 503, and bi-axial tilt about the in-plane axes (x and y)) provided by the outer MEMS structure.

Figure 6:
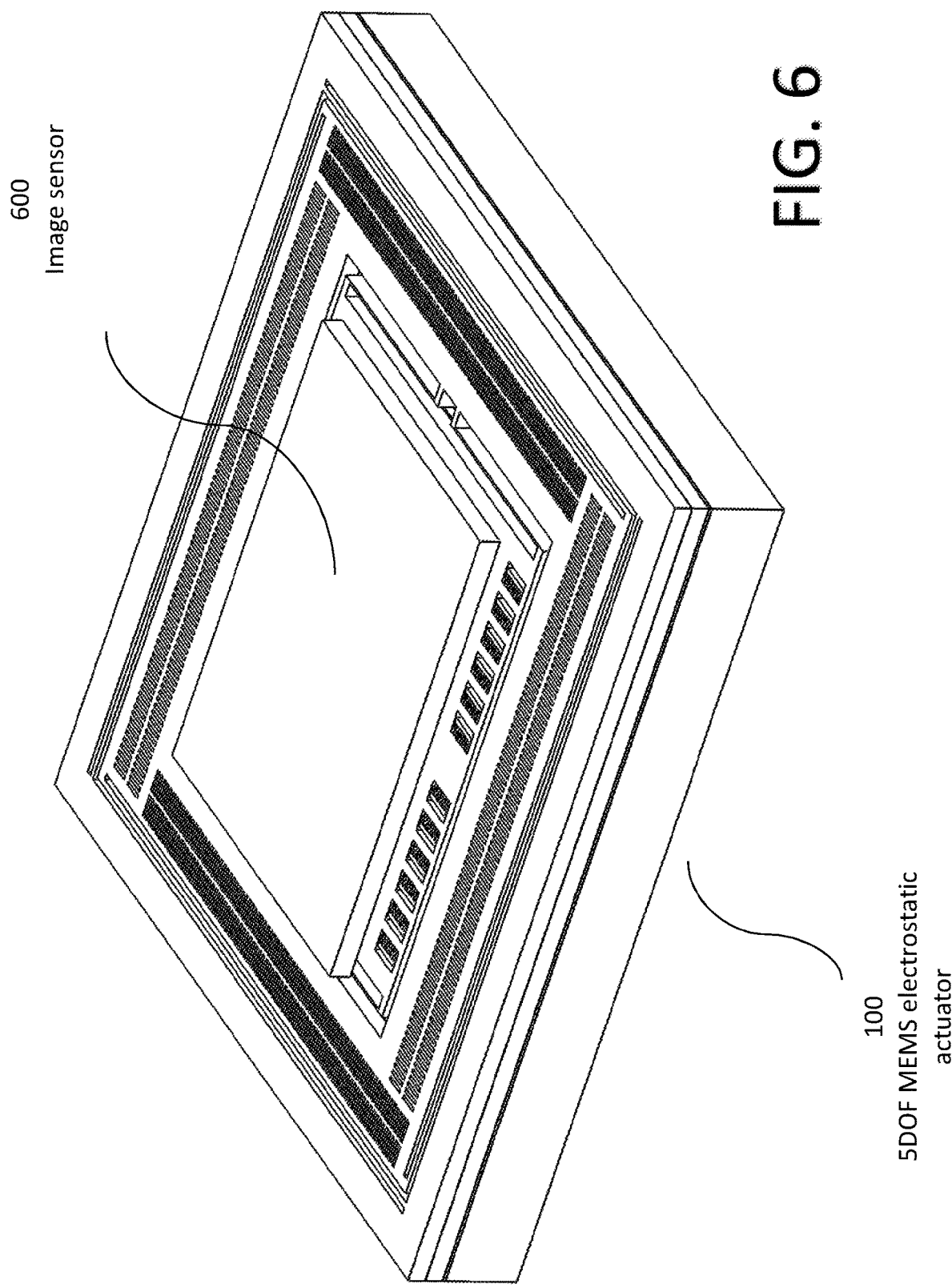
FIG. 6 is a perspective view of the image sensor loaded 5-DOF MEMS electrostatic actuator.
Figure 7:
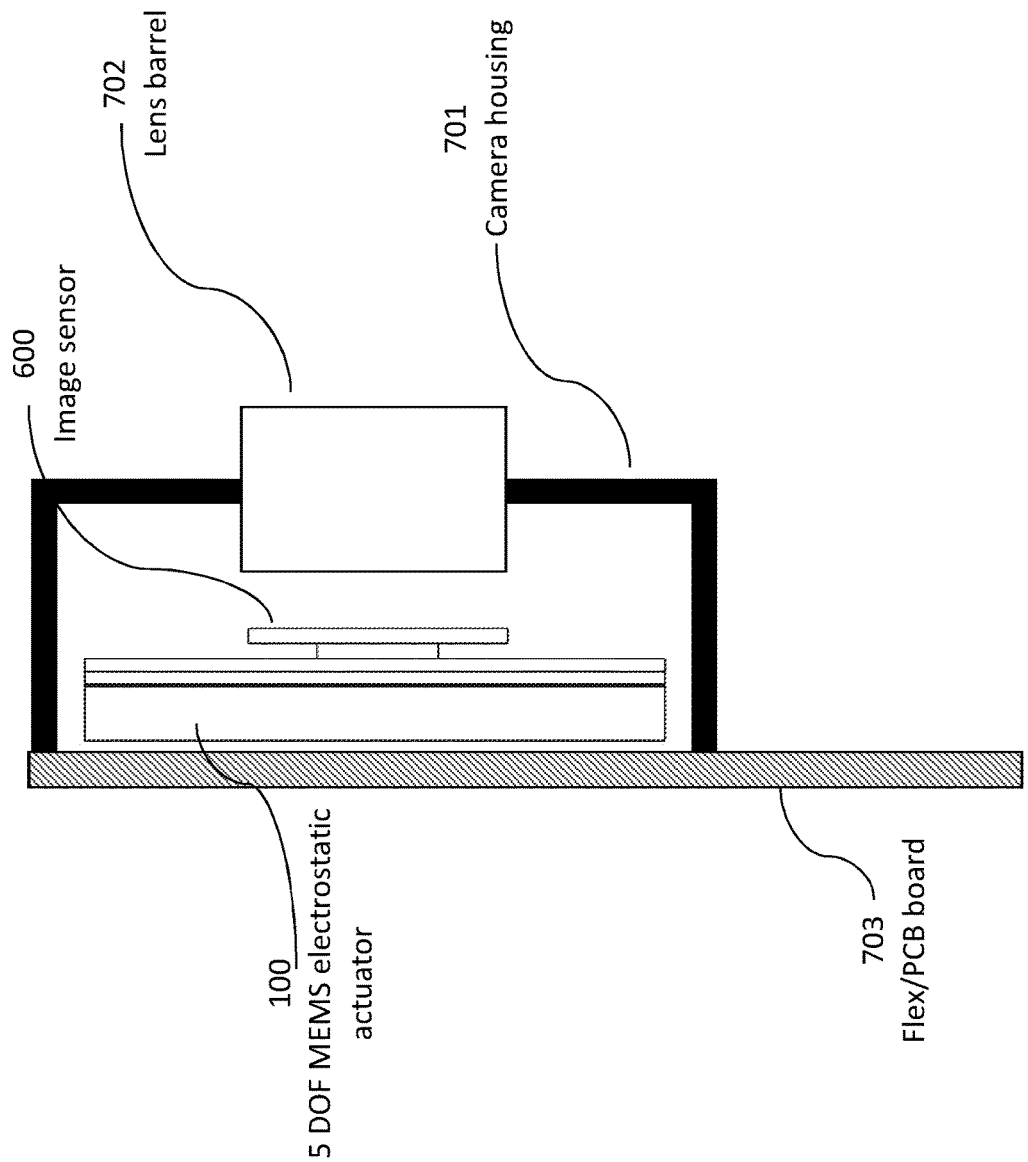
FIG. 7 is a side view of a camera module incorporating the present invention of the 5-DOF MEMS electrostatic actuator to achieve AF, OIS, and super resolution imaging.

In one embodiment of the present invention the 5 DOF MEMS electrostatic actuator is used to move the image sensor 600, refer to FIG. 6, within a camera module in 5-DOF motion such that it compensates for the handshake of the user (OIS functionality) for sharper images by translating the image sensor along the x and y axes as well as moving along the z-axis to achieve AF. The other 2 DOF motion of the actuator, bi-axial tilt about the x and y axes, can be used to correct for undesired lens tilt that ensue from the imperfections of the camera assembly or to enable new camera functionalities. The image sensor is attached to the load stage within the rotor of the inner MEMS structure using an adhesive. The image sensor could be wire-bonded directly to the PCB board without going through the structure of the MEMS actuator. FIG. 7 illustrates a camera module incorporating the 5-DOF MEMS electrostatic actuator. The camera consists of a housing 701, a flex/PCB board 703, an image sensor 600, 5-DOF MEMS actuator 100, and a lens barrel 702. The image sensor 600 is attached to the 5-DOF MEMS actuator 100 using an adhesive, and the actuator is attached to flex/PCB board using an adhesive from the back. In another embodiment, the flex/PCB board is attached to the MEMS from the front side of the MEMS for ease of wire bonding. The housing incorporates a lens barrel that is attached to the flex/PCB board using an adhesive. In such camera, the lens barrel could be of large design and lenses could be made of a heavy material such as glass. This is possible due to the fact that the lenses don't have to be moved for AF and OIS, therefore, the weight of the optics is flexible. In the present invention, both features (AF and OIS) can be achieved through the movement of the image sensor which has less weight.

The in-plane translation of the image sensor within the camera module can also achieve super resolution imaging, where sub-micron motion along the x and y axes is applied to the image sensor by the actuator to snap a number of images that are sub-pixel/pixel shifted. Those images are then super-imposed to create a single high-resolution image. However, such feature is difficult to achieve while the OIS system is in operation due to the difficulty in controlling the same rotors (inner and middle) to simultaneously achieve two functionalities (OIS and super-resolution). Therefore, the bi-axial tilt of the image sensor using the outer rotor actuation of sensor can be used to achieve super resolution as the tilt of the image sensor creates shifts in the image. However, such method is not ideal way of achieving super resolution as the image shifts produced by the sensor tilt motion is not uniform across the entire image.

Figure 8:
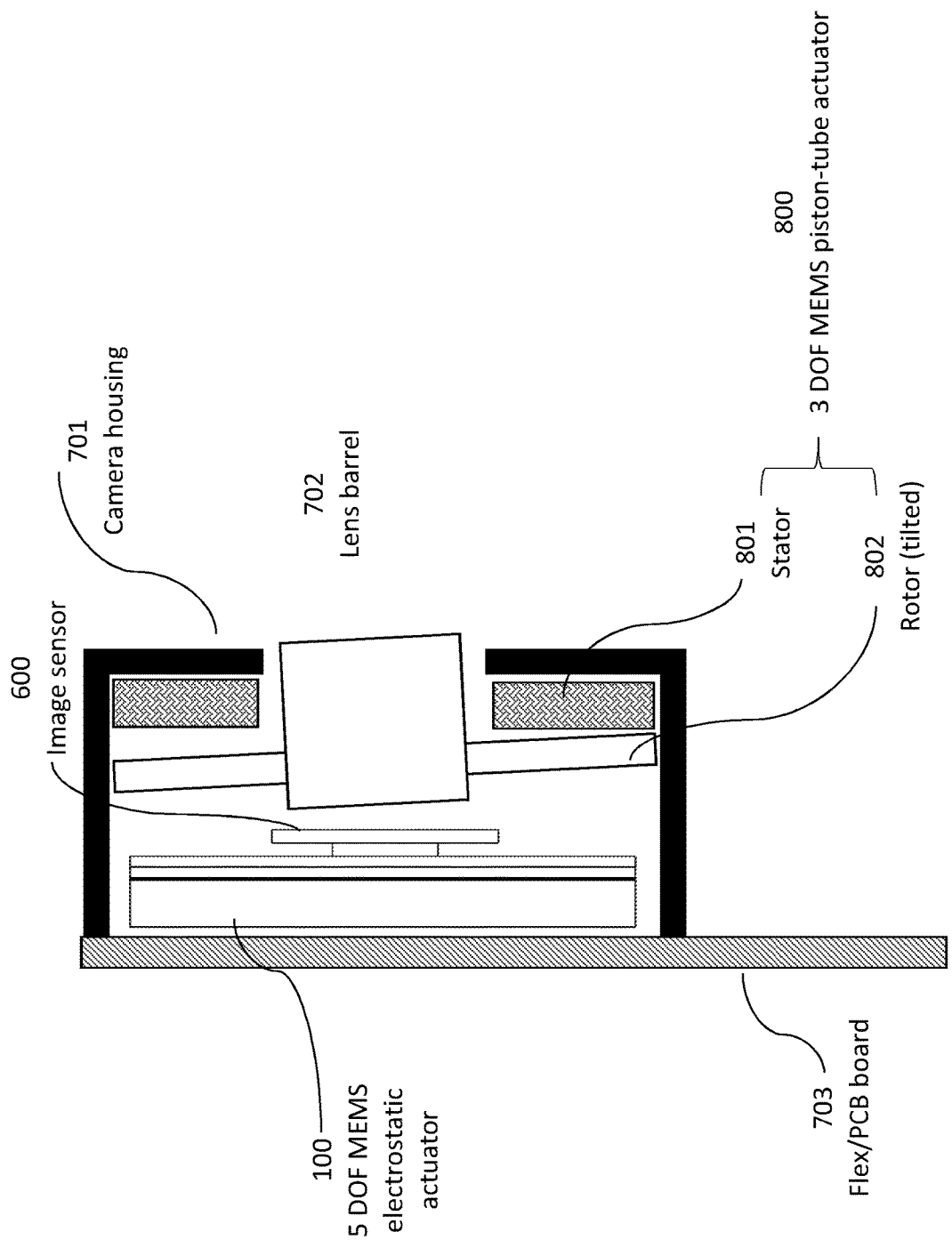
FIG. 8 is a side view of a camera module incorporating the present invention of the 5-DOF MEMS electrostatic actuator and a 3-DOF MEMS piston-tube electrostatic actuator to achieve extended stroke for AF, OIS, super resolution imaging and corrections for static and dynamic tilting capabilities.

FIG. 8 illustrates a camera module that is able to concurrently achieve OIS and super resolution. The camera incorporates the present invention of the 5-DOF MEMS electrostatic actuator 100, a 3-DOF MEMS piston-tube actuator 800 presented in U.S. Ser. No. 10/122,924B2 which is here incorporated by reference, a housing 701, flex/PCB board 703 and lens barrel 702. The 5-DOF MEMS actuator translates the image sensor along the optical axis z to achieve AF and translates it along the x and y axes to achieve OIS, while the 3-DOF MEMS piston-tube actuator (which consists if a stator 801 and rotor 802 that holds the lenses) tilts the lens barrel about the in-plane axes (x and y) to shift the image on the image sensor plane in sub-micron motion to achieve super resolution imaging. In this camera system, both feature of the OIS and super resolution imaging are achieved using two different actuators which makes it easier to control.

It could be apparent to the one with the ordinary skills in the art that the current invention could be altered in many ways without the departure from the soul of the present invention. For example, one may alter between the position of the inner, middle, and/or the outer MEMS structures. Therefore, all of the three MEMS structures are interchangeable where one structure can be moved to the position of the other.

It could be also apparent to the one with the ordinary skills in the art that the current invention of the actuator could be used as a MEMS sensor. Instead of applying voltages to provide motion, the present invention can be used to read the capacitance of the actuator electrodes in response, for example, to force, acceleration, touch on any other physical property that can be measured by the change of the electrode capacitance.

The foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

With respect to the above description, it is to be realized that the optimum relationships for the parts of the invention in regard to size, shape, form, materials, function and manner of operation, assembly and use are deemed readily apparent and obvious to those skilled in the art, and all equivalent relationships to those illustrated in the drawings and described in the specification are intended to be encompassed by the present invention.

What is claimed is:

1. A five degrees of freedom (5-DOF) M EMS electrostatic microactuator (microactuator), comprising:
   a) an inner MEMS structure, comprising an inner stator and an inner rotor, said inner rotor defining an x-y plane having an x-axis and a y-axis, and a z-axis being normal to the x-y plane, wherein said inner rotor comprises of a load stage to hold a load and a plurality of moving inner capacitive electrodes that are attached to the inner stator via a plurality of inner mechanical springs, said inner stator comprises of a plurality of fixed inner capacitive electrodes, wherein said plurality of moving and fixed inner capacitive electrodes in the inner MEMS structure engage in the presence of a voltage potential resulting in a translation of the inner rotor that holds the load along the x-axis or the y-axis;
   b) a middle MEMS structure, comprising a middle stator and a middle rotor, wherein said inner MEMS structure is rigidly attached to said middle rotor of the middle MEMS structure, said middle rotor comprises of a plurality of moving middle capacitive electrodes that are attached to the middle stator via a plurality of middle mechanical springs, said middle stator comprises of a plurality of fixed middle capacitive electrodes, wherein said plurality of moving and fixed middle capacitive electrodes in the middle MEMS structure engage in the presence of a voltage potential resulting in a translation of the middle rotor that holds said inner MEMS structure along the y-axis or the x-axis, and
   c) an outer MEMS structure, comprising an outer stator and an outer rotor, wherein said middle MEMS structure is rigidly attached to said outer rotor, said outer rotor comprises of a plurality of moving outer capacitive electrodes that are attached to the outer stator via a plurality of outer mechanical springs, said outer stator comprises of a plurality of fixed outer capacitive electrodes, wherein said plurality of moving and fixed outer capacitive electrodes in the outer MEMS structure engage in the presence of a voltage potential resulting in a translation of the outer rotor that holds said inner and middle MEMS structures along the axis z, and/or a bi-axial tilt of the outer rotor about the x-axis or the y-axis,
   d) said plurality of moving inner capacitive electrodes and said plurality of moving middle capacitive electrodes comprise an array of through openings or tubes having a plurality of walls, wherein a plurality of moving comb drive fingers extend from the plurality of walls of each said array of through openings or tubes along the x-y plane, and
   e) said plurality of fixed inner capacitive electrodes and said plurality of fixed middle capacitive electrodes comprise an array of pistons, wherein a plurality of fixed comb drive fingers extend from a lateral side of each piston along the x-y plane and interdigitate with said plurality of moving comb drive fingers in the inner and middle rotors.

2. The five degrees of freedom (5-DOF) MEMS electrostatic microactuator of claim 1, wherein said plurality of moving outer capacitive electrodes of said outer rotor comprise an array of through openings or tubes, and said plurality of fixed outer capacitive electrodes of said outer stator comprise an array of pistons that extend vertically along the z-axis.

3. The five degrees of freedom (5-DOF) MEMS electrostatic microactuator of claim 1, wherein the inner, the middle and the outer rotors form a common electrode and have a single polarity; wherein said plurality of fixed inner, middle and outer capacitive electrodes are grouped into a plurality of arrays of pistons; wherein the pistons in each array of pistons are electrically connected with each other forming a plurality of sub stators, wherein each sub stator is electrically insulated from pistons in other sub stators, wherein said sub stators in the inner and middle structure provide a bi-directional motion, and said sub stators in the outer rotor provide a translation along the z-axis and/or a bi-axial tilt motion about x and y axes.

4. The five degrees of freedom (5-DOF) MEMS electrostatic microactuator of claim 3, wherein said plurality of sub stators in said inner, middle and outer MEMS structures are electrically insulated from each other through an insulating layer of an SOI wafer.

5. The five degrees of freedom (5-DOF) MEMS electrostatic microactuator of claim 3, wherein the pistons in each said plurality of sub stators in said inner, middle and outer MEMS structures are electrically connected with each other through a conductive layer.

6. The five degrees of freedom (5-DOF) MEMS electrostatic microactuator of claim 1, wherein said inner MEMS structure is mechanically decoupled from said middle stator through back etching, and said middle MEMS structure is mechanically decoupled from said outer stator through back etching.

7. The five degrees of freedom (5-DOF) MEMS electrostatic microactuator of claim 1, wherein one of a sensor or an optical element is attached to said load stage of the microactuator and has 5 degrees of freedom motion provided by the microactuator.

8. A camera module, comprising:
a) a five degrees of freedom (5-DOF) MEMS electrostatic microactuator (microactuator), comprising:
   i) an inner MEMS structure, comprising an inner stator and an inner rotor, said inner rotor defining an x-y plane having an x-axis and a y-axis, and a z-axis being normal to the x-y plane, wherein said inner rotor comprises of a load stage to hold a load and a plurality of moving inner capacitive electrodes that are attached to the inner stator via a plurality of inner mechanical springs, said inner stator comprises of a plurality of fixed inner capacitive electrodes, wherein said plurality of moving and fixed inner capacitive electrodes in the inner MEMS structure engage in the presence of a voltage potential resulting in a translation of the inner rotor that holds the load along the x-axis or the y-axis;
   ii) a middle MEMS structure, comprising a middle stator and a middle rotor, wherein said inner MEMS structure is rigidly attached to said middle rotor of the middle MEMS structure, said middle rotor comprises of a plurality of moving middle capacitive electrodes that are attached to the middle stator via a plurality of middle mechanical springs, said middle stator comprises of a plurality of fixed middle capacitive electrodes, wherein said plurality of moving and fixed middle capacitive electrodes in the middle MEMS structure engage in the presence of a voltage potential resulting in a translation of the middle rotor that holds said inner MEMS structure along the y-axis or the x-axis, and
   iii) an outer MEMS structure, comprising an outer stator and an outer rotor, wherein said middle MEMS structure is rigidly attached to said outer rotor, said outer rotor comprises of a plurality of moving outer capacitive electrodes that are attached to the outer stator via a plurality of outer mechanical springs, said outer stator comprises of a plurality of fixed outer capacitive electrodes, wherein said plurality of moving and fixed outer capacitive electrodes in the outer MEMS structure engage in the presence of a voltage potential resulting in a translation of the outer rotor that holds said inner and middle MEMS structures along the axis z, and/or a bi-axial tilt of the outer rotor about the x-axis or the y-axis;
b) a circuit board attached to a top or a bottom side of said microactuator;
c) an image sensor attached to the load stage of said microactuator, wherein the said image sensor is wire-bonded directly to the circuit board;
d) a housing enclosing said microactuator and said image sensor, and
e) a set of optical lenses attached to said housing, whereby said microactuator displaces the image sensor along the x-y-plane in the x and y axes to achieve optical image stabilization and/or super resolution imaging, and translates the image sensor along the optical axis (z) to achieve autofocus.

9. The camera module of claim 8, wherein said microactuator tilts the image sensor about in-plane axes to correct for a static and dynamic optical tilt and/or achieving super resolution imaging.

10. A camera module, comprising:
a) a five degrees of freedom (5-DOF) MEMS electrostatic microactuator (microactuator), comprising:
   i) an inner MEMS structure, comprising an inner stator and an inner rotor, said inner rotor defining an x-y plane having an x-axis and a y-axis, and a z-axis being normal to the x-y plane, wherein said inner rotor comprises of a load stage to hold a load and a plurality of moving inner capacitive electrodes that are attached to the inner stator via a plurality of inner mechanical springs, said inner stator comprises of a plurality of fixed inner capacitive electrodes, wherein said plurality of moving and fixed inner capacitive electrodes in the inner MEMS structure engage in the presence of a voltage potential resulting in a translation of the inner rotor that holds the load along the x-axis or the y-axis;
   ii) a middle MEMS structure, comprising a middle stator and a middle rotor, wherein said inner MEMS structure is rigidly attached to said middle rotor of the middle MEMS structure, said middle rotor comprises of a plurality of moving middle capacitive electrodes that are attached to the middle stator via a plurality of middle mechanical springs, said middle stator comprises of a plurality of fixed middle capacitive electrodes, wherein said plurality of moving and fixed middle capacitive electrodes in the middle MEMS structure engage in the presence of a voltage potential resulting in a translation of the middle rotor that holds said inner MEMS structure along the y-axis or the x-axis, and iii) an outer MEMS structure, comprising an outer stator and an outer rotor, wherein said middle MEMS structure is rigidly attached to said outer rotor, said outer rotor comprises of a plurality of moving outer capacitive electrodes that are attached to the outer stator via a plurality of outer mechanical springs, said outer stator comprises of a plurality of fixed outer capacitive electrodes, wherein said plurality of moving and fixed outer capacitive electrodes in the outer MEMS structure engage in the presence of a voltage potential resulting in a translation of the outer rotor that holds said inner and middle MEMS structures along the axis z, and/or a bi-axial tilt of the outer rotor about the x-axis or the y-axis;

b) a circuit board attached to a top or a bottom side of said microactuator;

c) an image sensor attached to the load stage of said microactuator, wherein wire-bonding signals of the image sensor are channeled through the microactuator structures;

d) a housing enclosing said microactuator and said image sensor; and e) a set of optical lenses attached to said housing, whereby said microactuator displaces the image sensor along the x-y-plane in the x and y axes to achieve optical image stabilization and/or super resolution imaging, and translates the image sensor along the optical axis (z) to achieve autofocus.

11. A camera module, comprising:

a) a five degrees of freedom (5-DOF) MEMS electrostatic microactuator (microactuator), comprising:

i) an inner MEMS structure, comprising an inner stator and an inner rotor, said inner rotor defining an x-y plane having an x-axis and a y-axis, and a z-axis being normal to the x-y plane, wherein said inner rotor comprises of a load stage to hold a load and a plurality of moving inner capacitive electrodes that are attached to the inner stator via a plurality of inner mechanical springs, said inner stator comprises of a plurality of fixed inner capacitive electrodes, wherein said plurality of moving and fixed inner capacitive electrodes in the inner MEMS structure engage in the presence of a voltage potential resulting in a translation of the inner rotor that holds the load along the x-axis or the y-axis;

ii) a middle MEMS structure, comprising a middle stator and a middle rotor, wherein said inner MEMS structure is rigidly attached to said middle rotor of the middle MEMS structure, said middle rotor comprises of a plurality of moving middle capacitive electrodes that are attached to the middle stator via a plurality of middle mechanical springs, said middle stator comprises of a plurality of fixed middle capacitive electrodes, wherein said plurality of moving and fixed middle capacitive electrodes in the middle MEMS structure engage in the presence of a voltage potential resulting in a translation of the middle rotor that holds said inner MEMS structure along the y-axis or the x-axis, and iii) an outer MEMS structure, comprising an outer stator and an outer rotor, wherein said middle MEMS structure is rigidly attached to said outer rotor, said outer rotor comprises of a plurality of moving outer capacitive electrodes that are attached to the outer stator via a plurality of outer mechanical springs, said outer stator comprises of a plurality of fixed outer capacitive electrodes, wherein said plurality of moving and fixed outer capacitive electrodes in the outer MEMS structure engage in the presence of a voltage potential resulting in a translation of the outer rotor that holds said inner and middle MEMS structures along the axis z, and/or a bi-axial tilt of the outer rotor about the x-axis or the y-axis;

b) an image sensor attached to said load stage;

c) a circuit board attached to a top or a bottom side of said 5-DOF MEMS electrostatic microactuator;

d) a housing enclosing said 5-DOF MEMS electrostatic microactuator and said image sensor;

e) a set of optical lenses attached to said housing, and f) a 3 degrees of freedom MEMS piston-tube electrostatic microactuator placed around said set of optical lenses, whereby said 5-DOF MEMS electrostatic microactuator displaces the image sensor along the x-y-plane to achieve optical image stabilization, and translates the image sensor along the z axis to achieve autofocus (AF), and said 3 degrees of freedom MEMS piston-tube electrostatic microactuator tilts said set of optical lenses about the x-y plane to achieve super resolution imaging and extend an AF range of the camera module.

12. The camera module of claim 11, wherein said 5-DOF MEMS electrostatic microactuator tilts the image sensor about the x-y plane to correct for a static and dynamic optical tilt and/or achieve super resolution imaging.

13. The camera module of claim 11, wherein a set of wire-bonding signals of the image sensor are channeled through the inner, middle, and outer structures of the 5-DOF MEMS electrostatic microactuator.

\* \* \* \* \*